United States Patent
Nomura et al.

(10) Patent No.: US 6,388,211 B1
(45) Date of Patent: May 14, 2002

(54) METHOD OF MOLDING A MOLDING RESIN ON A SUBSTRATE HAVING OPENINGS, SWITCH SUBSTRATE WITH A MOLDING RESIN, METHOD OF FORMING A SWITCH PATTERN ON A SWITCH SUBSTRATE, AND A SWITCH SUBSTRATE

(75) Inventors: Osamu Nomura; Nobuyuki Yagi; Kozo Morita, all of Kanagawa-ken (JP)

(73) Assignee: Teikoku Tsushin Kogyo Co., Ltd., Kanagawa-Ken (JP)

(*) Notice: Subject to any disclaimer, the term of this patent is extended or adjusted under 35 U.S.C. 154(b) by 0 days.

(21) Appl. No.: 09/471,376

(22) Filed: Dec. 23, 1999

(30) Foreign Application Priority Data

Dec. 24, 1998 (JP) .......................................... 10-366390
Jun. 16, 1999 (JP) .......................................... 11-169907

(51) Int. Cl.[7] ................................................ H01H 1/58
(52) U.S. Cl. ..................... 200/11 DA; 29/622; 200/292
(58) Field of Search .................. 29/622, 829, 846–849; 174/250, 255; 200/11 R–11 DA, 564, 570, 571, 284, 292, 336

(56) References Cited

U.S. PATENT DOCUMENTS

| | | | |
|---|---|---|---|
| 3,809,733 A | | 5/1974 | Sandiford et al. ............. 264/45 |
| 4,443,670 A | * | 4/1984 | Nakamura et al. ....... 200/11 DA |
| 4,578,547 A | * | 3/1986 | Gunther et al. .......... 200/11 DA |
| 4,728,755 A | * | 3/1988 | Fowler et al. ........... 200/11 DA |
| 4,944,908 A | | 7/1990 | Leveque et al. ............. 264/232 |
| 5,155,306 A | * | 10/1992 | Iijima et al. ............. 200/11 DA |
| 5,298,698 A | | 3/1994 | Iida et al. ................ 200/11 DA |
| 5,359,165 A | * | 10/1994 | Leveque et al. ............. 200/317 |
| 5,743,380 A | | 4/1998 | Gauker ..................... 200/43.08 |
| 6,248,964 B1 | * | 6/2001 | Bailey et al. ........... 200/11 DA |

FOREIGN PATENT DOCUMENTS

| | | | |
|---|---|---|---|
| DE | 296 14317 | 12/1997 | ............. A47K/3/00 |
| EP | 0 304 112 | 2/1989 | ............. H05K/5/00 |
| EP | 0 307 977 | 3/1989 | ............. H05K/5/00 |
| EP | 0 358 504 | 3/1990 | ............. H01H/11/00 |
| EP | 0 847 069 | 6/1998 | .......... H01H/19/02 |
| GB | 526381 | 9/1940 | |

* cited by examiner

*Primary Examiner*—Michael Friedhofer
(74) *Attorney, Agent, or Firm*—Wenderoth, Lind & Ponack, L.L.P.

(57) ABSTRACT

A substrate (10), a first mold (200) and a second mold (250) are prepared, and a plurality of switch patterns (14), (18) are provided by providing openings (pattern-removal portions) (A) in such a manner that a pattern (11), which has been formed on the surface of the substrate (10), is divided into a plurality of patterns to form A switch substrate. Next, the switch substrate (1) is clamped between the first mold (200) and the second mold (250). At such time, the side of the switch substrate (1) provided with the switch patterns (14), (18) is brought into surface contact with an abutting surface (201) of the first mold (200) and, at the same time, a cavity (253) provided in the second mold (250) opposes the other side of the switch substrate. Next, a molten molding resin is charged into the cavity (253) provided in the second mold (250) to thereby fill the cavity (253) and the openings (A) of the substrate with the molding resin. After the molding resin hardens, the first mold (200) and the second mold (250) are separated and the switch substrate (1), which will have the molding resin case 40 attached thereto, is extracted.

20 Claims, 23 Drawing Sheets

METHOD OF MOLDING A MOLDING RESIN ON A SUBSTRATE HAVING OPENINGS, SWITCH SUBSTRATE WITH A MOLDING RESIN, METHOD OF FORMING A SWITCH PATTERN ON A SWITCH SUBSTRATE, AND A SWITCH SUBSTRATE

BACKGROUND OF THE INVENTION

This invention relates to a method of molding a molding resin on a substrate having openings, a switch substrate equipped with a molding resin, a method of forming a switch pattern on a switch substrate, and a switch substrate.

There is available a switch substrate for a rotary encoder which produces a desired coded output by causing a slider to come into sliding contact with contacts while being rotated. FIG. 20 is an enlarged plan view illustrating an example of such a switch substrate for a rotary encoder according to the prior art. The switch substrate shown in FIG. 20 includes a hard insulating substrate 80 on which are provided a first switch pattern group 81, a second switch pattern group 87 and a common switch pattern 93. Terminal connection lands 85, 89 and 95 are led out from the switch pattern groups 81, 87 and common switch pattern 93, respectively. The first switch pattern group 81 is constructed by connecting four code-output switch patterns 84 by a connecting pattern 81a, the second switch pattern group 87 is constructed by connecting four code-output switch patterns 90 by a connecting pattern 87a, and the common switch pattern 93 is formed in the shape of a circular arc.

By causing a slider to make sliding contact with the switch patterns while being rotated along a path indicated by two concentric dot-and-dash lines, a desired coded output is obtained depending upon the position at which the slider makes contact.

If patterns of the printed type are used as the switch pattern groups 81, 87 and common switch pattern 93, i.e., if the patterns are formed by coating a silver pattern with a carbon pattern, for example, paste printing is employed as the forming technique. As a consequence, such portions as sides 82 of the switch patterns 84 and sides 88 of the switch patterns 90 cannot be formed to have accurate and precise dimensions, a variance in position occurs and, as a result, an accurate coded output that conforms to the position of the slider is not obtained.

An example of a method proposed to solve this problem involves forming the switch substrate by punching a metal plate, the shape of which corresponds to the switch pattern groups 81, 87 and common switch pattern 93, by press cutting, and attaching the metal plate to an insulating substrate made of molding resin. A problem which arises, however, is that the manufacturing cost involved with this method is higher than that of the method of printing the switch pattern groups 81 and 87 on the insulating substrate.

SUMMARY OF THE INVENTION

Accordingly, an object of the present invention is to provide a method of forming switch patterns on a switch substrate easily, precisely and at low cost.

Another object of the present invention is to provide a method of molding a molding resin on a substrate having openings, wherein the surface of the substrate can be made flat even though the substrate has openings.

According to the present invention, there is provided a method of molding a molding resin on a substrate having openings, comprising preparing a substrate having openings, a first mold and a second mold and clamping the substrate having the openings between the first and second molds in such a manner that one side of the substrate is brought into surface contact with a surface of the first mold while, at the same time, a cavity provided in the second mold is made to oppose the other side of the substrate. A molten molding resin is charged into the cavity provided in the second mold to thereby fill the cavity and the openings of the substrate with the molding resin. The substrate, which has the molding resin attached thereto, is then extracted by separating the first and second molds after the molding resin hardens, thereby molding the molding resin on the substrate having the openings.

The substrate having the openings preferably is a substrate made of synthetic resin and having openings.

In a preferred embodiment, the substrate having the openings is a switch substrate having switch patterns formed on one side thereof, the switch patterns and the openings being situated on a path along which a slider makes sliding contact with the switch patterns.

The second mold preferably is provided with pressing portions for pressing peripheries of the openings of the substrate against the first mold.

In a preferred embodiment, positions at which the pressing portions press the substrate against the first mold are situated at the periphery of the openings but not on the path along which the slider makes sliding contact with the switch patterns.

In a preferred embodiment, the switch substrate is manufactured by the steps of forming patterns on a surface of a substrate in advance, and then providing openings by removing pattern-removal portions of the patterns, thereby forming switch patterns with which the slider makes sliding contact.

Further, according to the present invention, there is provided a switch substrate equipped with molding resin, the switch substrate having switch patterns formed on one side thereof. Openings and the switch patterns are situated on a path along which a slider makes sliding contact with the switch patterns. A molding resin is attached to the substrate in a state in which it is in surface contact with a side of the switch substrate on which no switch patterns are provided. The height of the surface of the molding resin exposed at the openings provided in the switch substrate is made to coincide with the height of the side of the switch substrate on which the switch patterns are provided, thereby constructing a switch substrate equipped with molding resin.

Further, according to the present invention, there is provided a method of molding a molding resin on a switch substrate, comprising manufacturing a switch substrate by forming patterns on a surface of a film-like substrate in advance, then providing openings by removing pattern-removal portions of the patterns to thereby form switch patterns with which a slider makes sliding contact. The switch substrate, a first mold and a second mold are prepared and, the switch substrate is clamped between the first and second molds in such a manner that one side of the switch substrate is brought into surface contact with a surface of the first mold while, at the same time, a cavity provided in the second mold is made to oppose the other side of the switch substrate. A molten molding resin is charged into the cavity provided in the second mold to thereby fill the cavity and the openings of the substrate with the molding resin. The switch substrate, which has the molding resin attached thereto, is then extracted by separating the first and second molds after the molding resin hardens.

Further, the present invention provides a method of forming switch patterns, with which a slider is to make sliding contact, on a switch substrate. The method includes forming patterns on a surface of a substrate in advance, and forming switch patterns by removing pattern-removal portions of the patterns.

The removal step may be removal of the patterns only, or removal, together with the patterns, of the substrate on which the patterns have been formed.

Further, the present invention provides a method of forming switch patterns, with which a slider is to make sliding contact, on a switch substrate. The method includes forming patterns on a surface of a substrate in advance, and forming insulating patterns at portions between these patterns that are to become switch patterns. The switch patterns are formed by removing pattern-removal portions at boundaries between the patterns and insulating patterns.

Further, the present invention provides a switch substrate, in which switch patterns with which a slider is to make sliding contact, are formed on a substrate. Insulating patterns are then formed at portions between the switch patterns.

Many apparently widely different embodiments of the present invention can be made without departing from the spirit and scope thereof. Therefore, it is to be understood that the invention is not limited to the specific embodiments thereof except as defined in the appended claims.

DETAILED DESCRIPTION OF THE INVENTION

Preferred embodiments of the present invention will now be described in detail with reference to the drawings.

First Embodiment

Figure 1:
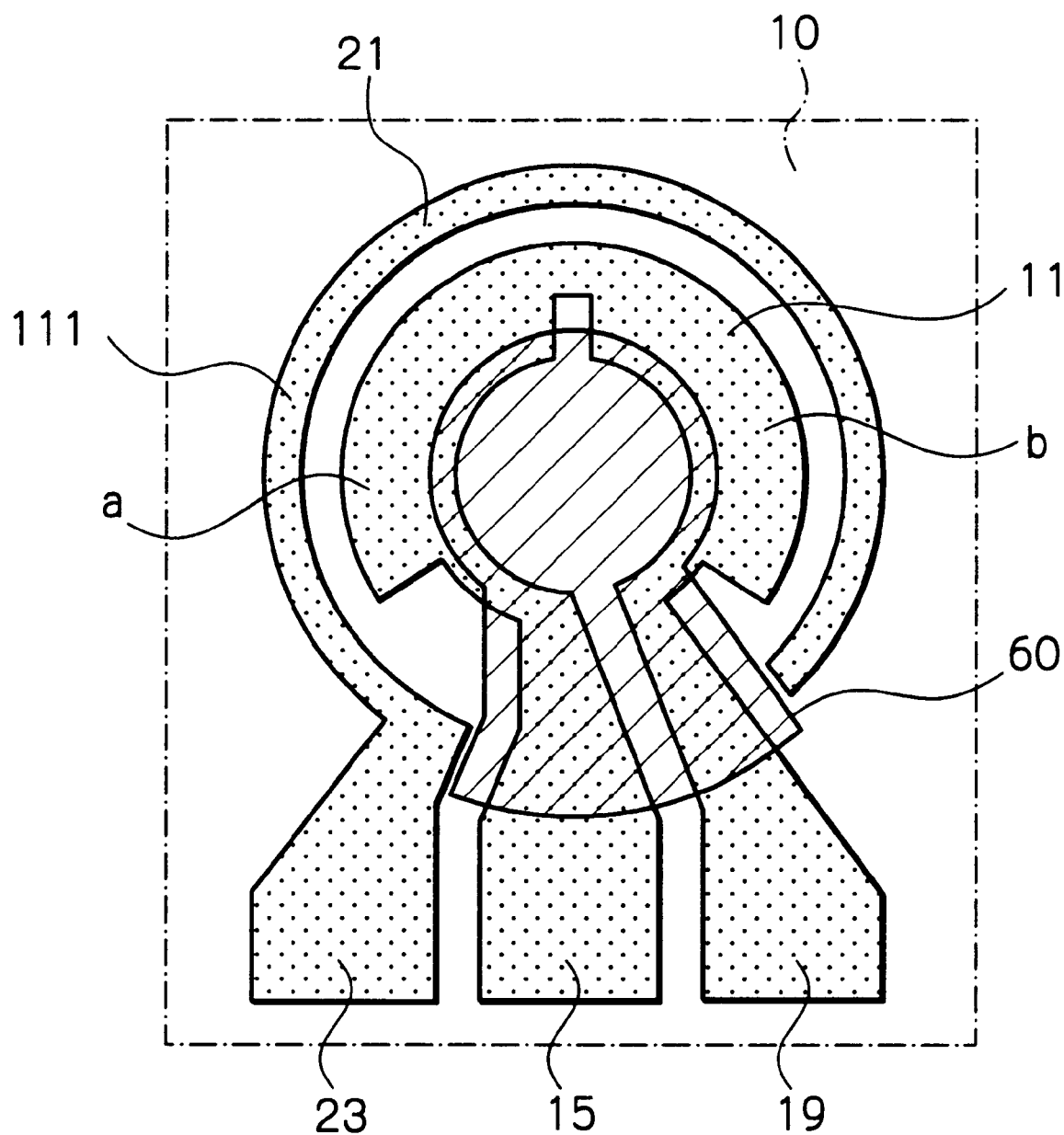
FIG. 1 is a plan view illustrating a method of forming switch patterns on a switch substrate according to a first embodiment of the present invention.
Figure 2:
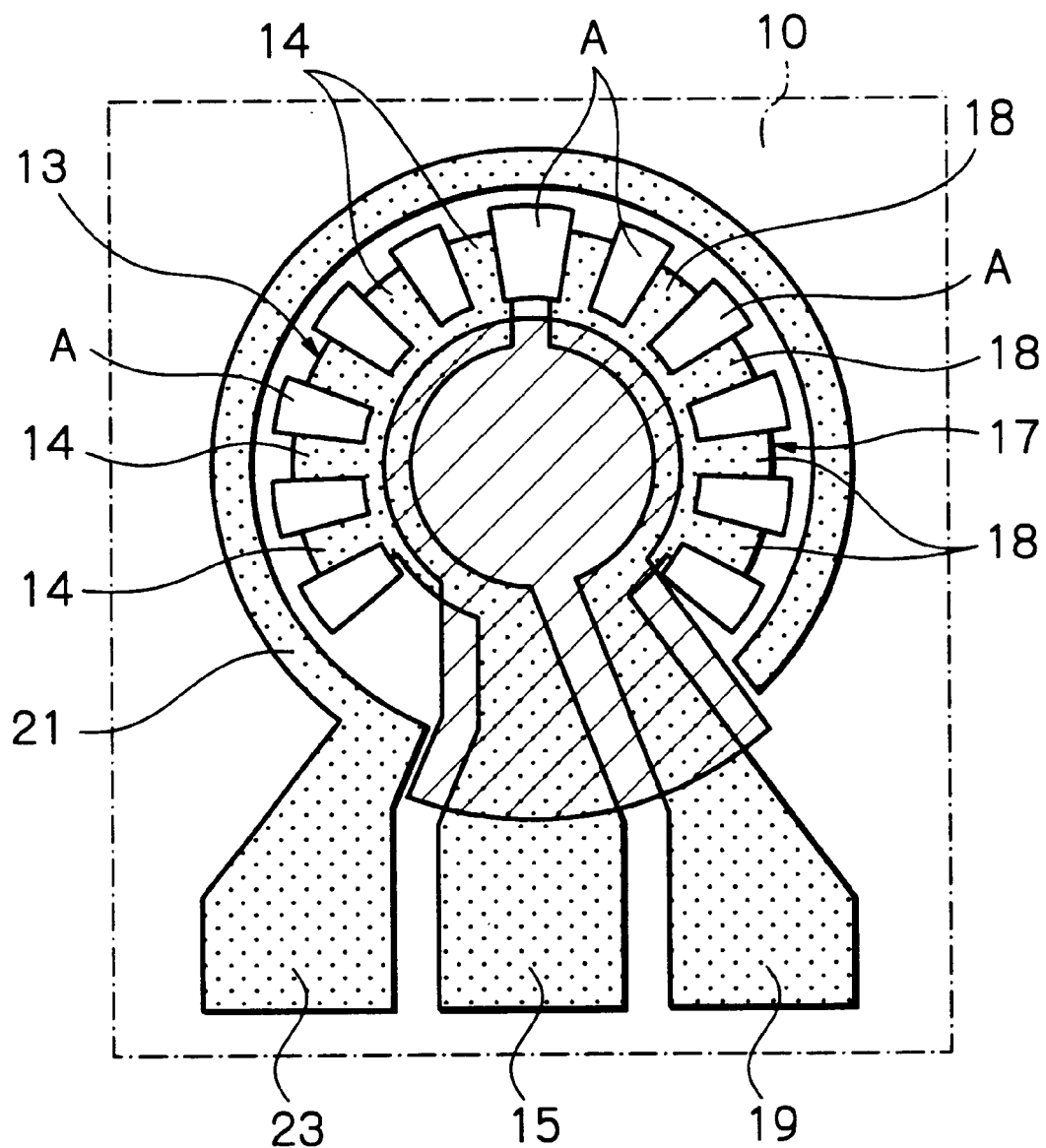
FIG. 2 is a plan view illustrating a method of forming switch patterns on a switch substrate according to a first embodiment of the present invention.

FIGS. 1 and 2 are diagrams illustrating a first embodiment in which a method of forming switch patterns on a switch substrate in accordance with the present invention is applied to a method of forming switch patterns on a switch substrate for a rotary encoder. Specifically, in accordance with the first embodiment, as shown in FIG. 1, there is prepared a substrate 10 made of a flexible synthetic resin (e.g., polyethylene terephthalate (PET) film, polyphenylene sulfate (PPS) film, polymide film or polyimide film or polyether imide film). A pattern 11, a pattern 111 and an insulating layer 60 are formed on the surface of the substrate 10 by printing. The patterns 11 and 111 are formed by printing silver paste in the shapes of the patterns 1' and 111, and by printing a carbon paste by overcoating so as to cover the patterns of silver paste. (The materials used for the printed patterns, the shapes of the patterns and the printing structure can be changed in a variety of ways.)

The shape of the pattern 11 is that obtained by connecting terminal connection lands 15, 19 to both ends of portions a, b that will serve respectively as first and second switch pattern groups 13, 17, described later. The shape of the pattern 111 is that obtained by connecting a terminal connecting land 23 to one end of an arcuate common switch pattern 21.

The insulating layer 60 is formed by printing it on the top side of the pattern 11 along the inner periphery of the portions a, b and on the top side of the pattern 11 where the terminal connection lands 15, 19 are led out from the portions a, b, respectively.

Next, prescribed areas of the portions a, b of pattern 11 are removed mechanically by, for example, using a press to form 11 pattern-removal portions A comprising openings which pass through the pattern 11 and the substrate 10, as shown in FIG. 2. Depending upon the case, however, the pattern 11 at the pattern-removal portions A may be removed by a laser beam rather than by mechanical removal means.

In other words, press cutting is used to form the first and second switch pattern groups 13, 17, each of which has five comb-shaped code output switch patterns 14, 18, respectively, on the portions a, b, respectively.

Figure 3:
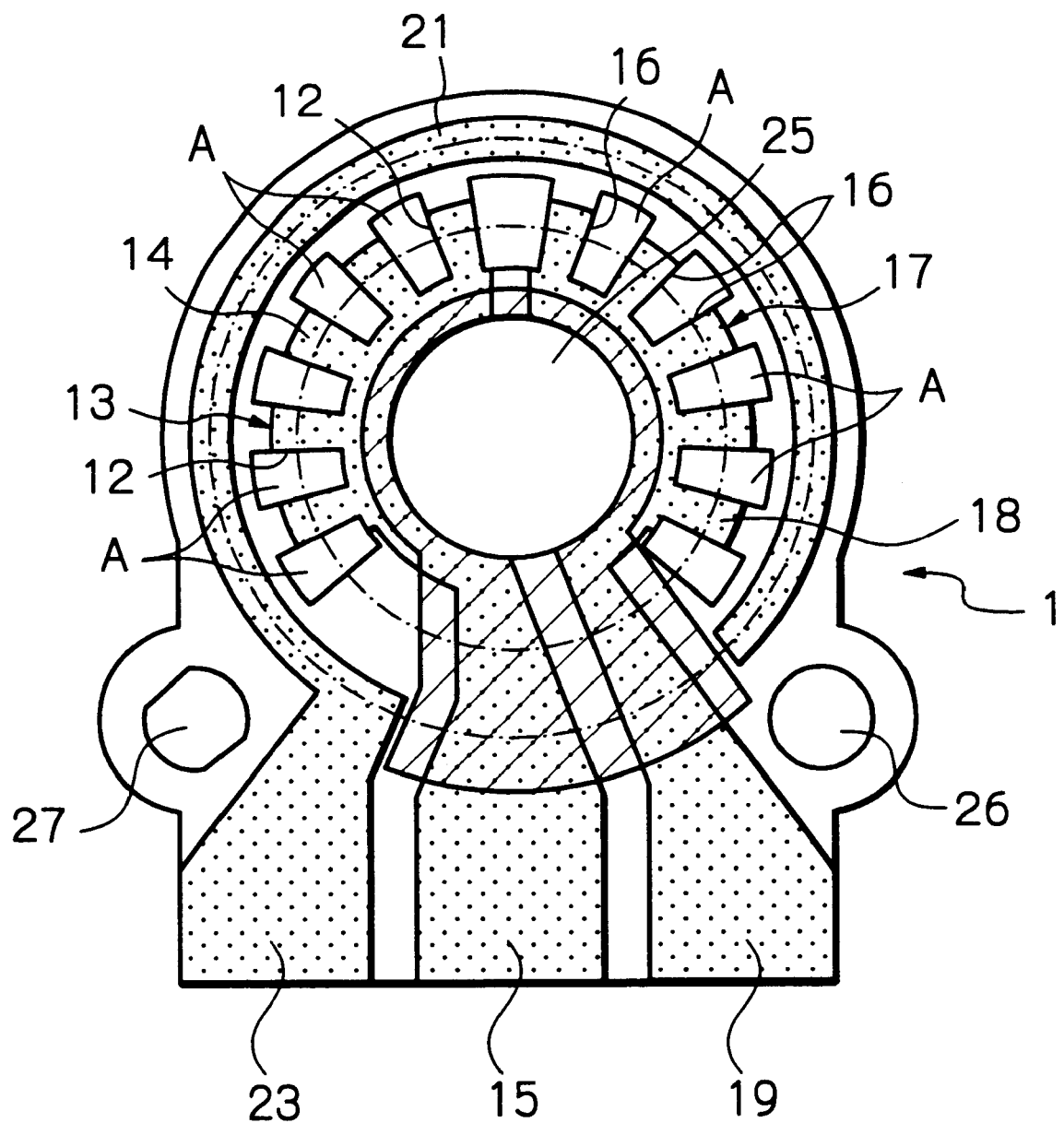
FIG. 3 is a plan view illustrating the switch substrate when completed.

Finally, as shown in FIG. 3, the portion of the substrate 10 externally of the periphery of the common switch pattern 21 is removed mechanically as by a press and a center hole 25 and holes 26, 27 are formed in the substrate 10 also by the same mechanical means. This completes the formation of a substrate 1 having openings. Since this embodiment of the present invention is based upon a switch, the substrate 1 having the openings shall be referred to as a switch substrate 1.

It should be noted that the pattern-removal portions A, the outer peripheral portion of the switch substrate 1 and the holes 25, 26 and 27 may be formed at one time by mechanical removal relying upon a press or the like.

It should also be noted that removal by a laser beam may be used instead of mechanical removal as by a press in order to form the pattern-removal portions A, the outer peripheral portion of the common switch pattern 21 and the holes 25, 26, 27.

Portions at sides 12, 16 (see FIG. 3) of the switch patterns 14, 18 thus formed can be formed accurately to have precise dimensions by virtue of the pattern-removal portions A, and the position of a slider that slides on the patterns (the sliding path is indicated by the two concentric dot-and-dash lines) can be detected with high precision so that an accurate coded output conforming to the position of the slider may be obtained.

Figure 4:
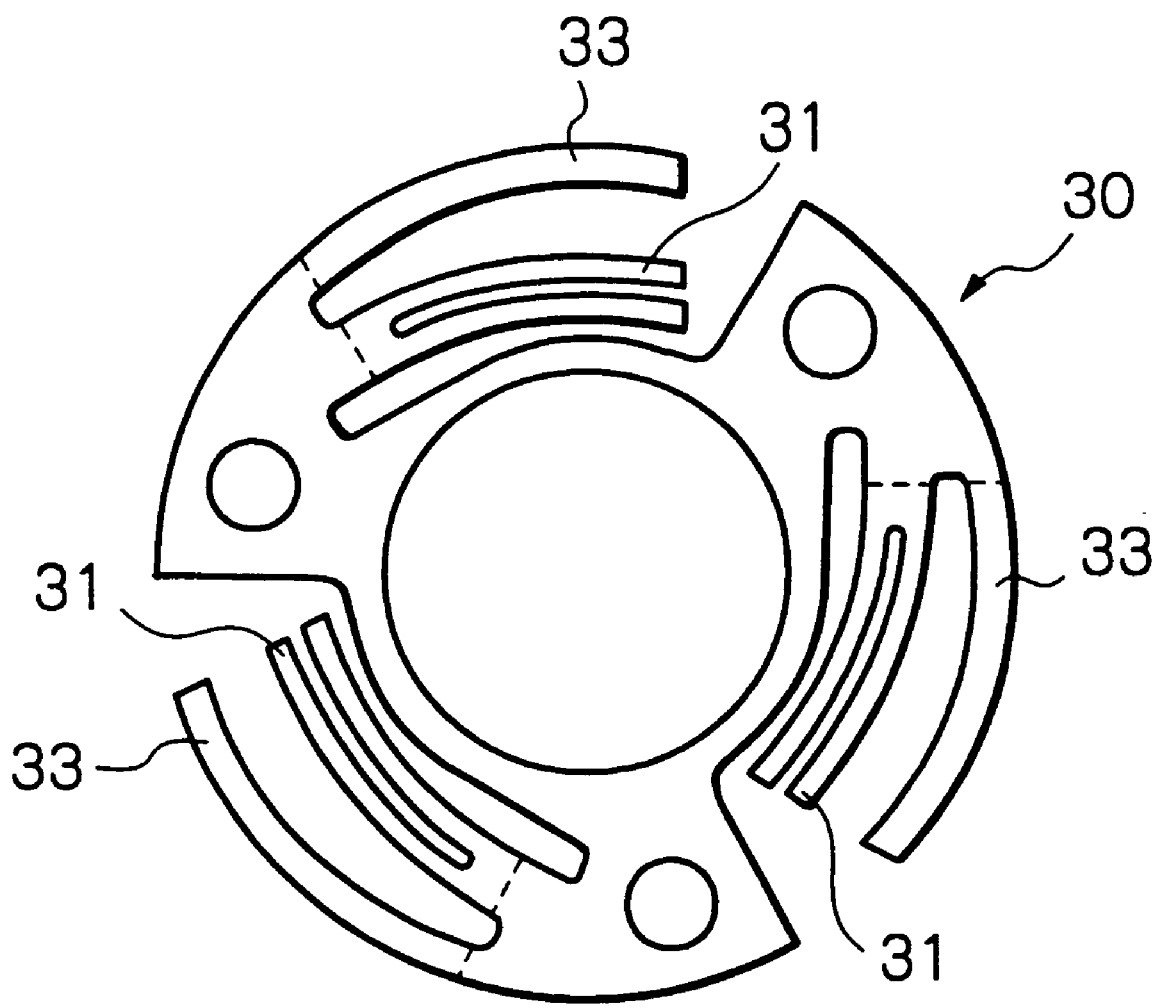
FIG. 4 is a plan view illustrating a slider used with the switch substrate.
Figure 5:
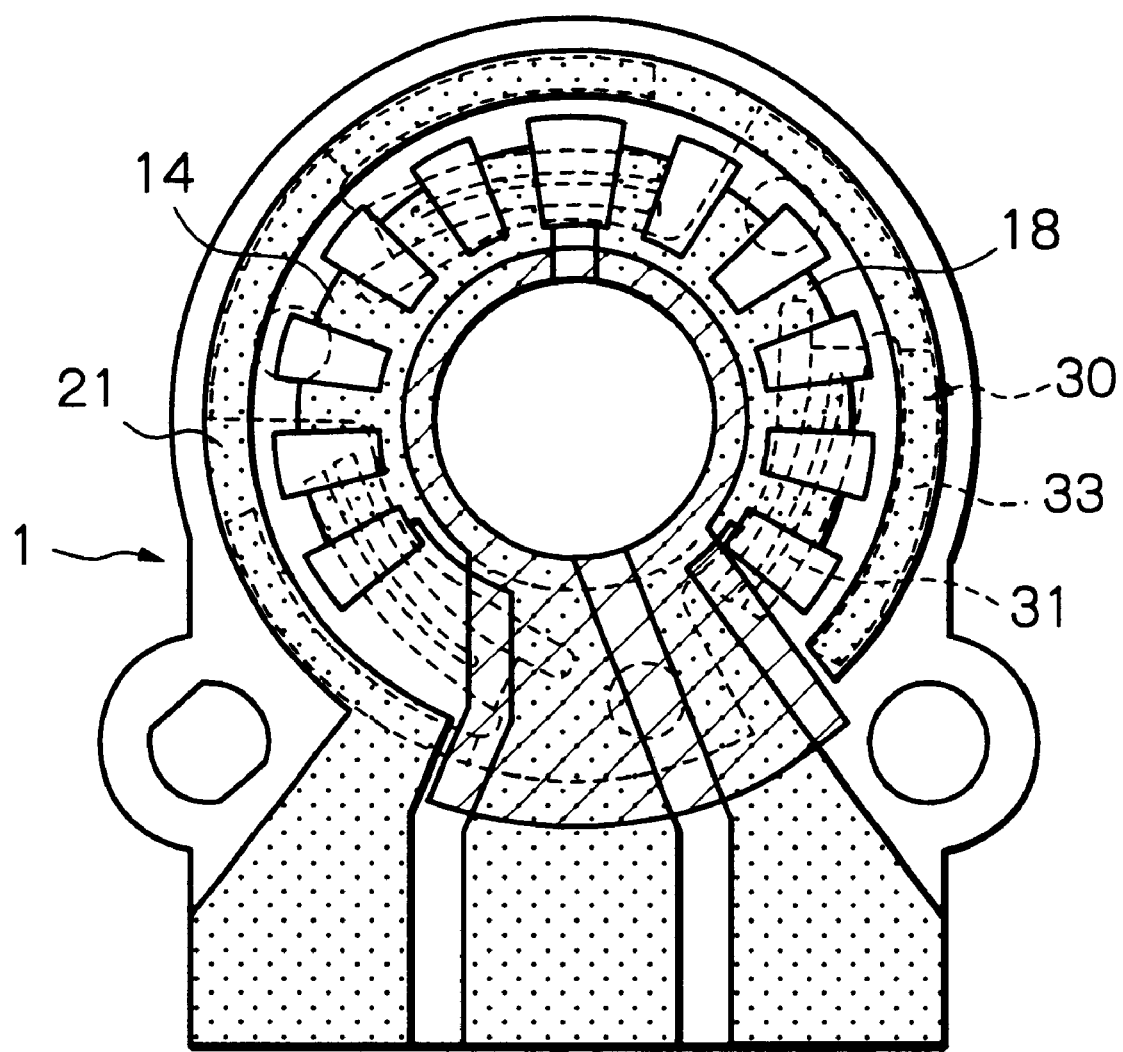
FIG. 5 is a diagram showing a position at which the slider is placed on the switch substrate.

FIG. 4 is a plan view illustrating a slider 30 used with the switch substrate 1, and FIG. 5 is a diagram showing a position at which the slider 30 is placed on the switch substrate 1. In actuality, the slider 30 is attached to a sliding element (not shown) that is capable of being rotated.

As shown in FIGS. 4 and 5, the slider 30 is provided with three sets of sliding contacts 31, 33 at an equal spacing (at intervals of 120°). Any one of the outer sliding contacts 33 of the three sets of sliding contacts is always in sliding contact with the common switch pattern 21. The inner sliding contacts 31 make or break contact with the switch patterns 14, 18, whereby coded outputs displaced in phase, described later, can be produced.

More specifically, the switch pattern group 13 and the switch pattern group 17 are provided at positions offset from each other by slightly more than the spacing of 120°. The timing at which a sliding contact 33 of the slider 30 makes contact with any of the switch patterns 14 and the timing at which a sliding contact 33 of the slider makes contact with the corresponding switch pattern 18, therefore, are slightly out of phase. As a result, on/off signals output by the switch pattern group 13 and off/off signals output by the switch pattern group 17 are also slightly out of phase. This makes it possible to detect whether the slider 30 is being rotated clockwise or counter-clockwise.

Since the switch substrate 1 is flexible, it generally is used by being placed and secured on a hard base. In this embodiment, the switch substrate 1 is insert-molded in a case 40 made of molding resin, as illustrated in FIG. 6.

Figure 6:
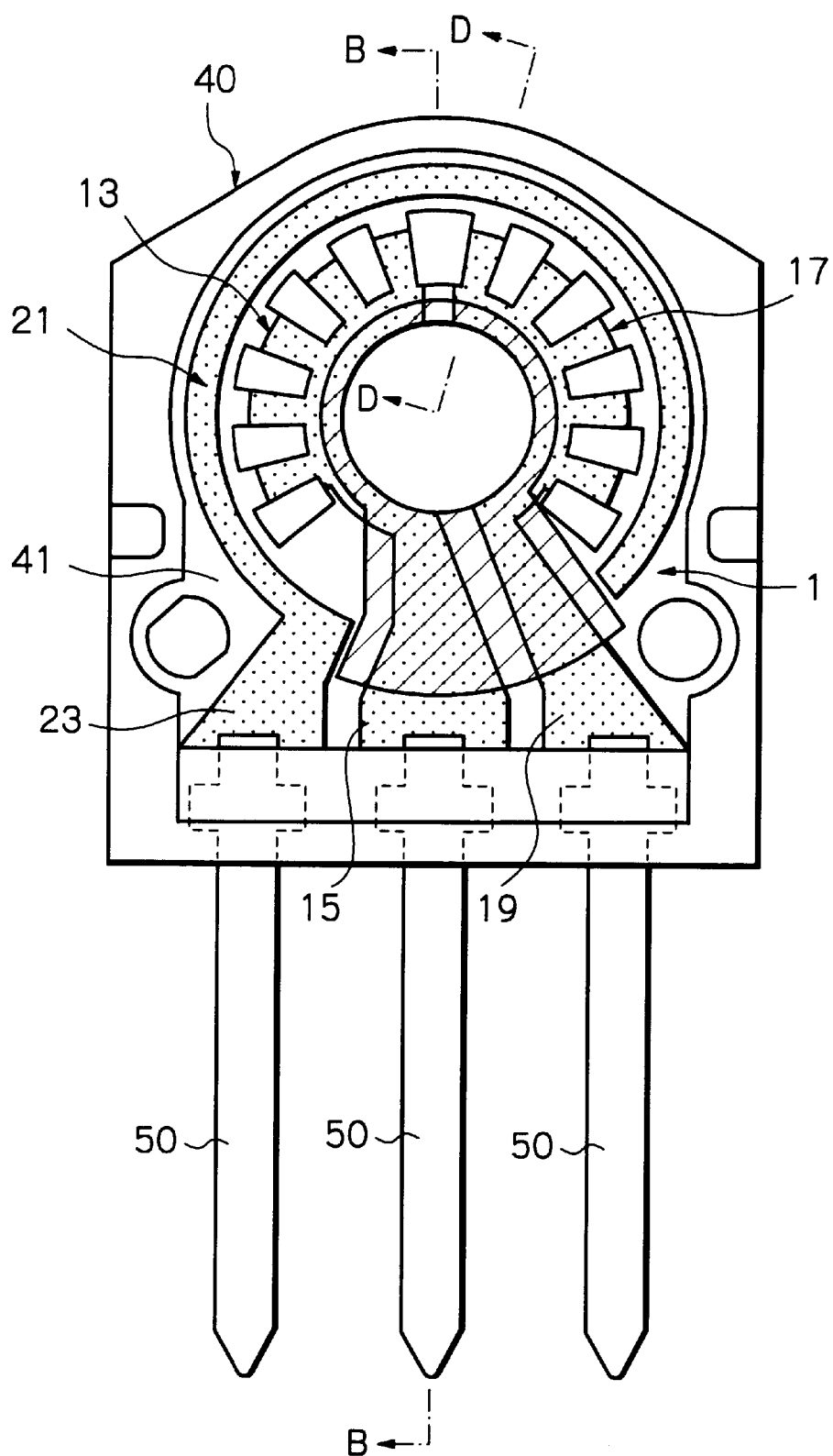
FIG. 6 is a plan view illustrating a state in which the switch substrate has been insert-molded in a case 40.
Figure 7:
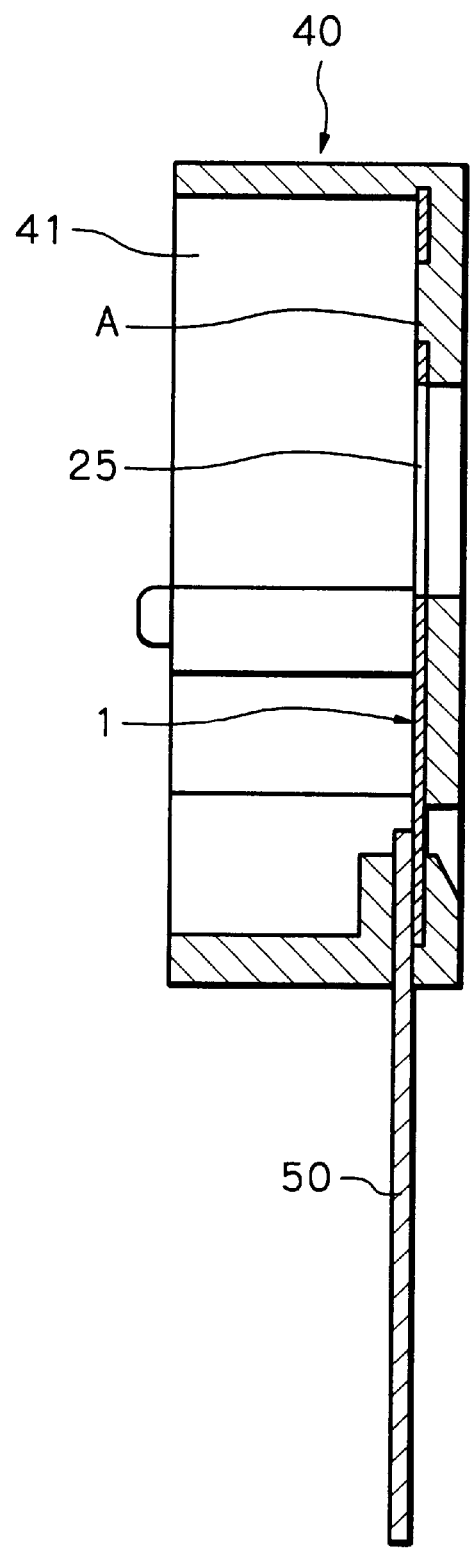
FIG. 7 is a sectional view taken along line B—B in FIG. 6.

More specifically, FIG. 6 is a plan view illustrating a state in which the switch substrate 1 has been insert-molded in the case 40. That is, FIG. 6 shows a switch substrate equipped with a molding resin case. FIG. 7 is a sectional view taken along line B—B in FIG. 6, FIG. 8 a rear view and FIG. 9 a sectional view taken along line D—D in FIG. 6. As shown in FIGS. 6 to 9, the case 40 is molded in such a manner that the underside and peripheral side surfaces of the switch substrate 1 are covered, the case 40 being provided with a recess 41 exposing the switch pattern groups 13, 17 and common switch pattern 21. A sliding element (not shown) to which the slider 30 has been attached is received in the recess 41 and is free to rotate.

One of the ends of each of the terminals 50, made of metal plates, is in abutting contact with a respective one of the terminal connection lands 15, 19, 23, and the abutting portions are embraced from above and below by the molding resin constructing part of the case 40, thereby connecting and fixing the terminals.

The pattern-removal portions A shown in FIG. 3 are openings. However, by filling these openings with molding resin in the manner shown in FIG. 7, the height of the surface molding resin exposed from the pattern-removal portions A and the height of the side of the switch substrate 1 on which the switch pattern groups 13 and 17 have been formed coincide. As a result, unevenness on the sliding path of the slider 30 indicated by the dot-and-dash lines in FIG. 3 is eliminated. Therefore, when the slider 30 is rotated to bring the sliding contacts 31 into sliding contact with the switch pattern groups 13, 17, this operation can be performed smoothly without resistance. The lifetime of the slider, therefore, is prolonged.

Various molding resins such as polybutylene terephthalate (PBT), PET and PPS, for example, may be used as the case 40 material.

Figure 8:
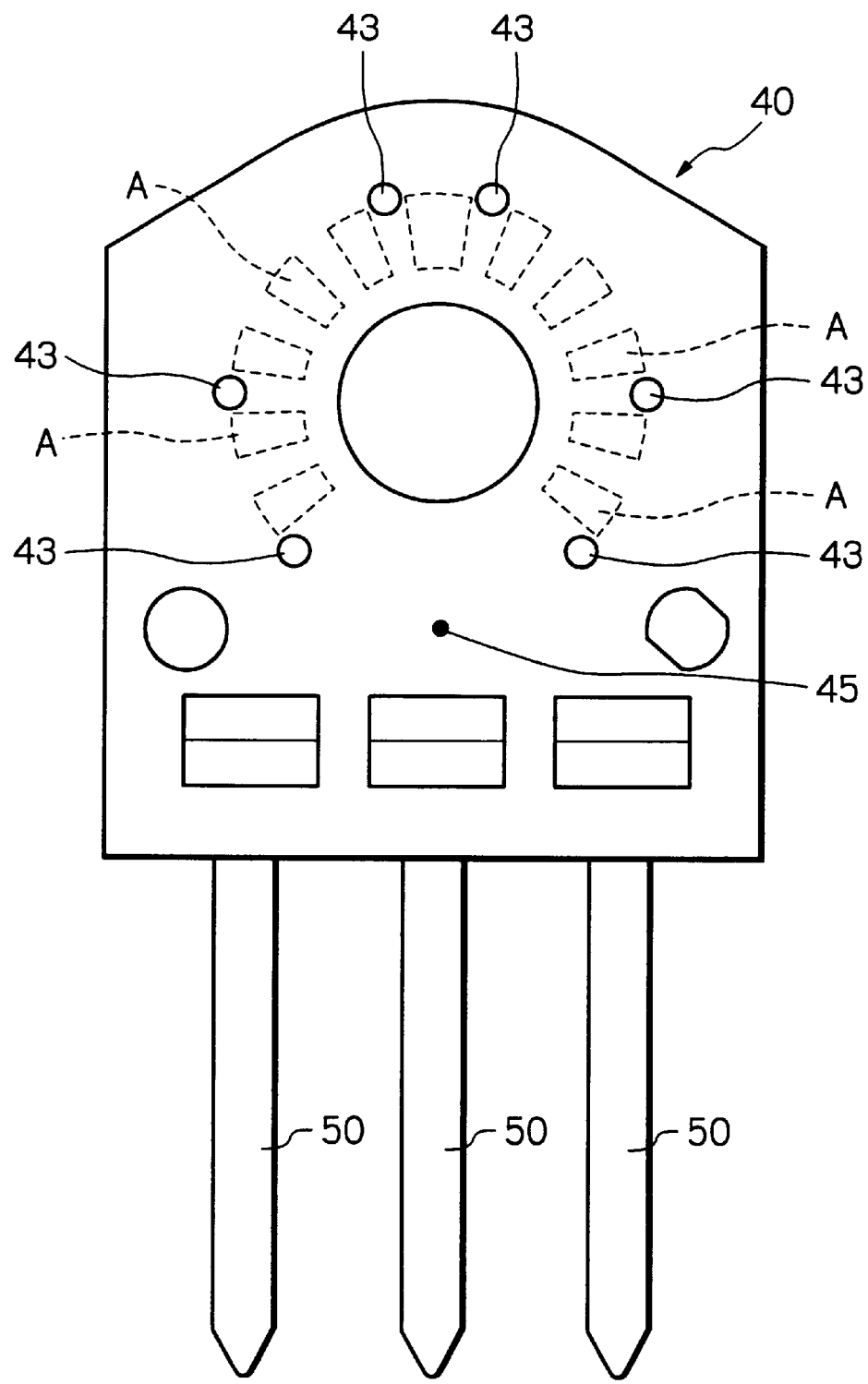
FIG. 8 is a rear view of the switch substrate insert-molded in the case.
Figure 9:
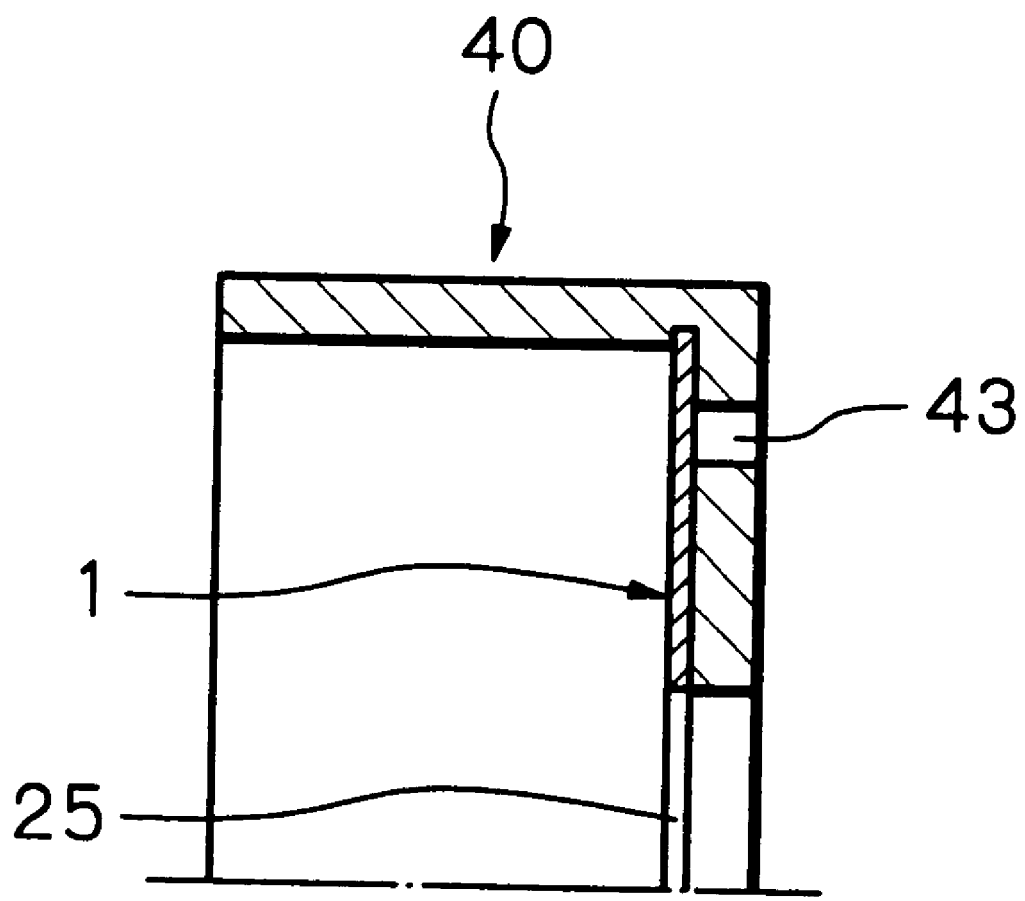
FIG. 9 is a sectional view taken along line D—D in FIG. 6.

The case 40 is provided with six holes 43, as depicted in FIGS. 8 and 9. The switch substrate 1 is exposed as the bottom of the holes 43. The positions of the holes are on the periphery of the pattern-removal portions A but not on the path along which the slider 30 slides. Though the details will be described later, the purpose of the holes 43 is as follows. In order to mold the case 43, the switch substrate 1 is clamped between first and second molds and a molten molding resin is charged into the molds on the side of the switch substrate 1 not having the formed switch pattern groups 13, 17. At such time the holes 43 assure that the molten resin, which has penetrated the pattern-removal portions A, will not flow onto the side of the switch substrate 1 on which the switch pattern groups 13, 17 have been formed. The method of molding the molding resin onto the switch substrate 1 will now be described.

Figure 10:
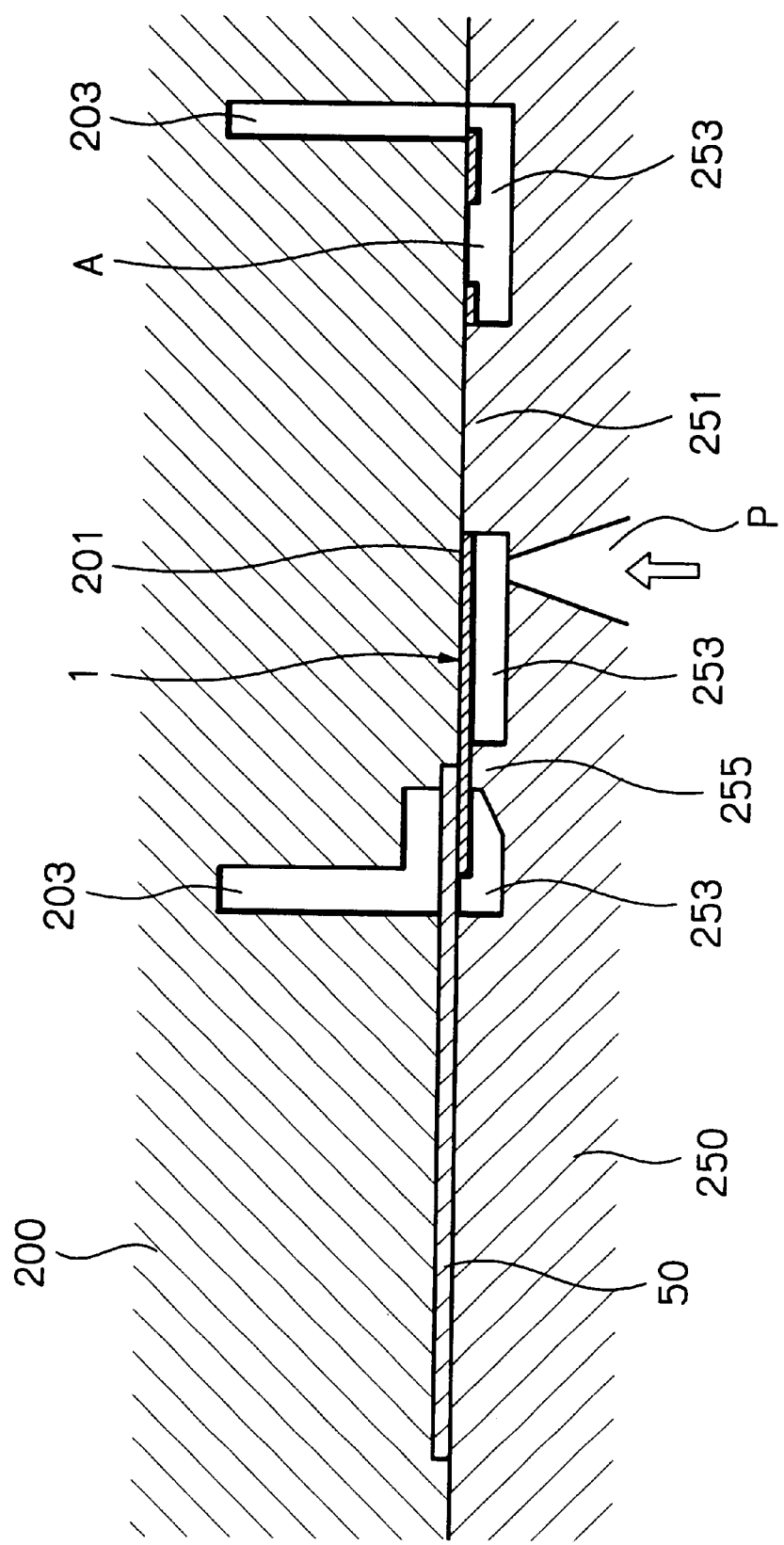
FIG. 10 is a sectional view illustrating a portion corresponding to FIG. 7 when the switch substrate is clamped between first and second molds.
Figure 11:
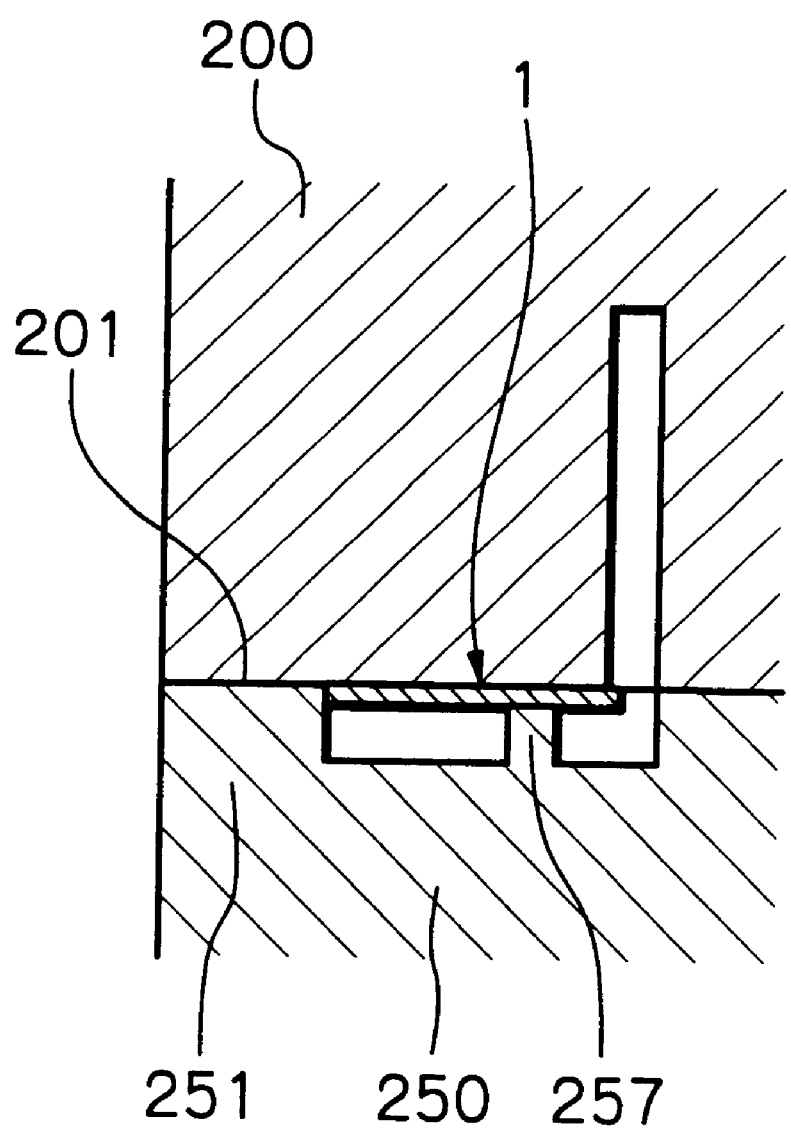
FIG. 11 is a sectional view illustrating a portion corresponding to FIG. 9 when the switch substrate is clamped between the first and second molds.

Specifically, to form the case 40 by molding the molding resin onto the switch substrate 1, each of the metal terminal plates 50 are placed on a respective one of the terminal connection lands 15, 19, 23 on the switch substrate 1 shown in FIG. 3. Under these conditions, the switch substrate 1 is clamped between a first mold 200 and a second mold 250, as illustrated in FIG. 10. FIG. 10 is a sectional view illustrating a portion corresponding to FIG. 7 when the switch substrate 1 is clamped between the first and second molds 200 and 250, and FIG. 11 is a sectional view illustrating a portion corresponding to FIG. 9 when the switch substrate 1 is clamped between the first and second molds 200 and 250.

The first mold 200 is provided with an abutting surface 201 that abuts against the side of the switch substrate 1 on which the switch pattern groups 13, 17 have been formed. The periphery of the abutting surface 201 is provided with a cavity 203 so as to surround the abutting surface. (The cavity 203 defines part of the shape of the case 40.)

The second mold 250 is provided with a cavity 253 forming part of the shape of the case 40. The second mold 250 is further provided with a projection 251 that is inserted into the center hole 25 of the switch substrate 1 so that the distal end face thereof abuts against the first mold 200. Pressing portions 255 press the portions at which the switch substrate 1 and edges of the metal terminal plates 50 overlap against the first mold 200, and pressing portions 257 press the area of the switch substrate 1 near the portions at which the pattern-removal portions A are provided against the first mold 200, as shown in FIG. 11.

If molten molding resin under a high temperature and pressure is forcibly introduced from a pin gate P provided in the second mold 250, the cavities 253, 203 are filled with the molten molding resin, after which the molding resin is allowed to cool and harden. Subsequently separating the first and second molds 200, 250 provides the completed switch substrate 1 in the case 40 as shown in FIGS. 6 to 8 attached thereto. The position of the pin gate P is the position indicated at 45 in FIG. 8. Specifically, the position 45 of the pin gate is spaced away from the pattern-removal-portions A defining the openings. This is so that the high-pressure molding resin will not act upon the pattern-removal portions A directly.

Since the injection of the molten molding resin is carried out under conditions of high temperature and pressure (e.g., 260° C., 100–600 kgf/cm2), as set forth above, the molding resin that has penetrated the pattern-removal portions A of the switch substrate 1 shown in FIG. 10 will attempt to flow between the switch substrate 1 and the abutting surface 201 if the switch substrate 1 peels off the abutting surface 201. If this occurs, there is the danger that a film of the molding resin will build up on the side of the switch substrate 1 on which the switch pattern groups 13, 17 have been formed, resulting in a defective product. According to this embodiment, therefore, the portions of the switch substrate 1 surrounding the pattern-removal portions A are pressed strongly against the abutting surface 201 by the pressing portions 257, thereby reliably preventing the molding resin from flowing between the switch substrate 1 and first mold 200. Further, since the portions surrounding the pattern-removal portions A are pressed strongly against the abutting surface 201, the surface of the completed switch substrate 1 (with the case 40) on which the switch pattern groups 13, 17 have been formed and the surface of the molding resin exposed at the pattern-removal portions A can be made flush in reliable fashion. The holes 43 are formed by the pressing portions 257.

In this embodiment, the pressing portions 257 press the portions surrounding the pattern-removal portions A, but the pressed positions are not positions on the sliding path of the slider 30. If the position of the sliding path of slider 30 were to be pressed from below by the pressing portions 257, the holes 43 would be formed on the underside of the sliding path. If the slider 30 were to slide over these holes, the switch substrate 1 would sink at the locations of the holes 43, with poor contact possibly being the result. It should be noted, however, that no particular measures need be taken if the holes 43 are small in size or the switch substrate 1 possesses enough rigidity so as not to flex due to sliding contact with the slider 30.

In this embodiment, a film-like substrate comprising a synthetic resin film is used as the insulating substrate of the switch substrate 1. Due to the method of manufacture described above, the surface of the switch substrate 1 on which the switch pattern groups 13, 17 have been formed and the surface of the molding resin exposed at the pattern-removal portions A can be made flush in reliable fashion. Alternatively, a metal plate that has been cut to have dimensions identical with those of the switch pattern groups 13, 17, common switch pattern 21 and the terminal connection lands 15, 19, 23 connected to these patterns can also be insert-molded as the switch substrate in the case 40 through a method similar to that described above in such a manner that the surface of the metal plate is left exposed.

In a case where the aforesaid metal plate is used, however, it is difficult to make the surface of the metal plate and the surface of the molding resin exposed at the periphery thereof flush in reliable fashion. When the slider is slid over the surface, therefore, there is the danger that problems such as chattering will occur.

Figure 21:
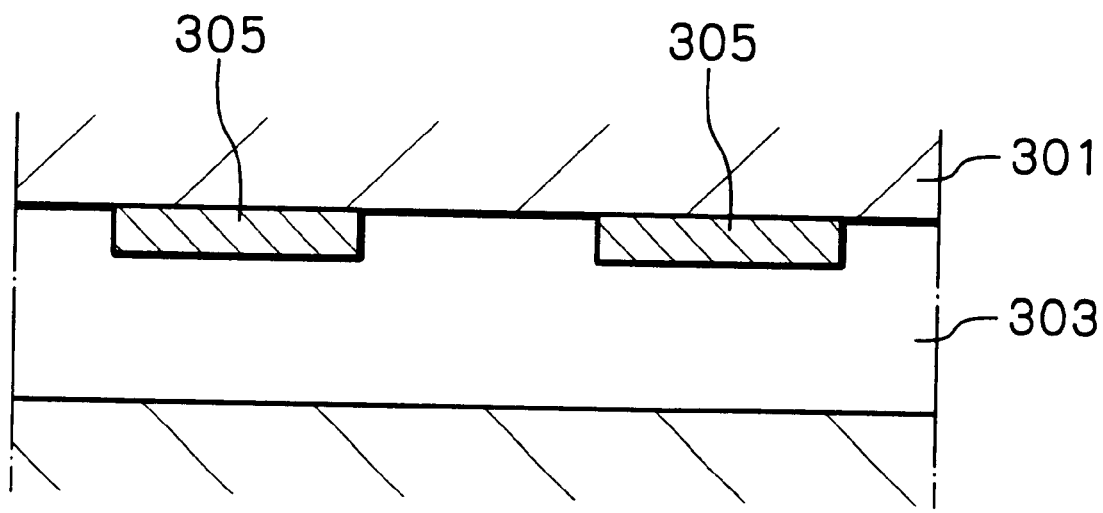
FIG. 21 is a diagram showing a method of insert-molding a metal plate.
Figure 22:
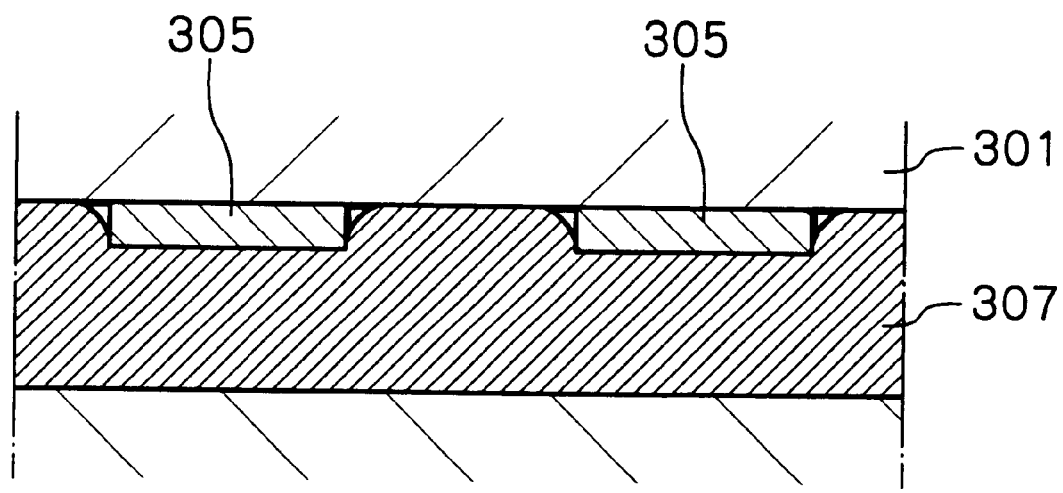
FIG. 22 is a diagram showing a method of insert-molding the metal plate.

In other words, the thermal conductivity of a metal plate is higher than that of the synthetic resin film. If a metal plate 305 is used and is abutted against the surface of one metal mold 301, as shown in FIG. 21, and a molten molding resin 307 is charged into a cavity 303, as shown in FIG. 22, then the molten molding resin 307 which comes into contact with the metal plate 305 will lose heat and begin to harden too quickly. Therefore, the resin eventually will harden leaving a small gap between the metal plate 305 and the surface of the mold 301. By contrast, if a synthetic resin film is used as an insulating substrate of the switch substrate 1, the thermal conductivity thereof is less than that of a metal plate and the molten molding resin does not lose any heat. Accordingly, the molten molding resin in contact with the switch substrate 1 does not lose heat and does not begin to harden too quickly. Thus, the molten molding resin fills the openings provided in the switch substrate 1 which precludes any problems.

Figure 23:
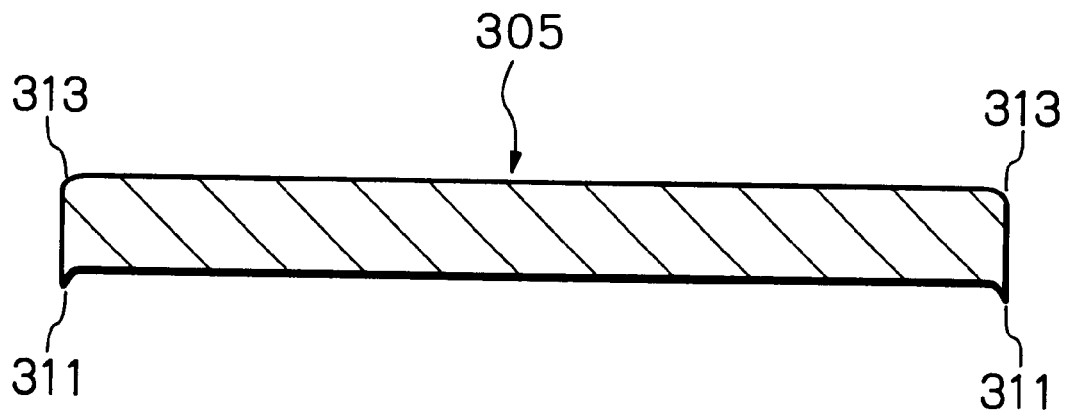
FIG. 23 is an enlarged sectional view of the metal plate.

Further, if the metal plate 305 is used, the plate is manufactured by press cutting. Burrs 311 of the kind shown in FIG. 23 are produced on one surface of the metal plate 305 at the outer periphery thereof, and sagging 313 occurs on the other surface of the metal plate 305 at the outer periphery thereof. (The burrs 311 and sag 313 are shown in exaggerated form in FIG. 23 in order to make them more noticeable.) As a consequence, if the metal plate 305 is used as is, the slider that slides on the plate may develop problems such as chattering. In a case where the insulating substrate of the switch substrate 1 is a synthetic resin film and an electrically conductive paste consisting of metal powder mixed with a resin material is used as switch pattern groups 13, 17, the hardness of the substrate is less than that of the metal plate 305 and the cut cross section will not develop the burrs 311 and sag 313. The problem of burrs and sag, therefore, is solved.

The foregoing embodiment illustrates an example in which the present invention is applied to the switch substrate 1 for a rotary encoder. However, it goes without saying that the invention is applicable also to various other switch substrates such as switch plates for slide switches. Further, the foregoing embodiment illustrates an example in which the case 40 is attached by forming the molding resin on a switch substrate having openings. However, the invention may be applied to a case where a molding resin base is molded on various other substrates having openings (inclusive of a variety of substrates other than switch substrates).

Further, the openings need not necessarily be holes. The openings may have the shape of cut-outs (e.g., comb-shaped cut-outs) cut from the outer periphery or inner periphery of the switch substrate 1.

The switch substrate 1 may be mounted on a base by a fixing method other than insert-molding. The materials of the substrate and molding resin are not limited to those described in the foregoing embodiment, and materials other than those mentioned may be employed. The substrate may be a hard substrate depending upon the particular case.

Further, the foregoing embodiment illustrates an example in which the switch pattern groups 13, 17 and common switch pattern 21 are formed by printing. However, the switch patterns may be formed by other methods, including the etching of copper foil. What is essential is that the switch patterns consist of a material that can be removed mechanically or by a laser beam. It goes without saying that the shape of the switch patterns can be changed in various ways.

In the foregoing embodiment, the molding resin is molded on the switch substrate 1 about the periphery of the metal terminals 50 attached thereto. However, a structure may be adopted in which a film-like substrate forming the switch substrate 1 is lead out to the exterior directly without using the metal terminals 50. If a film-like substrate is used as the substrate, then a separate circuit can be provided directly on the film-like substrate led out to the exterior.

Second Embodiment

Figure 12A:
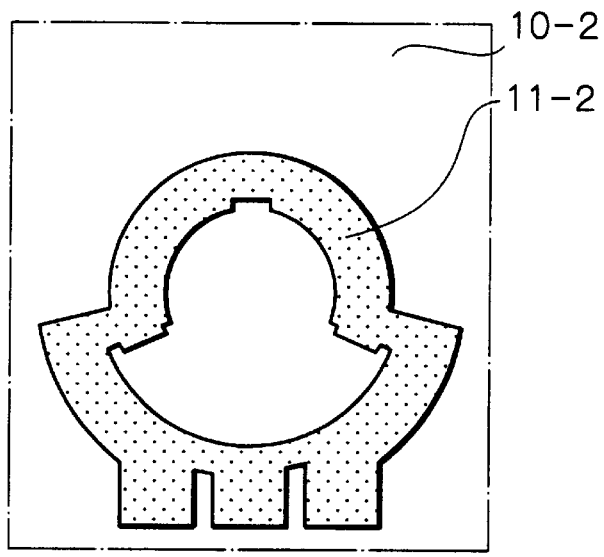
FIGS. 12(a), 12(b) and 12(c) are plan views showing a method of forming switch patterns on a switch substrate according to a second embodiment of the present invention.
Figure 12B:
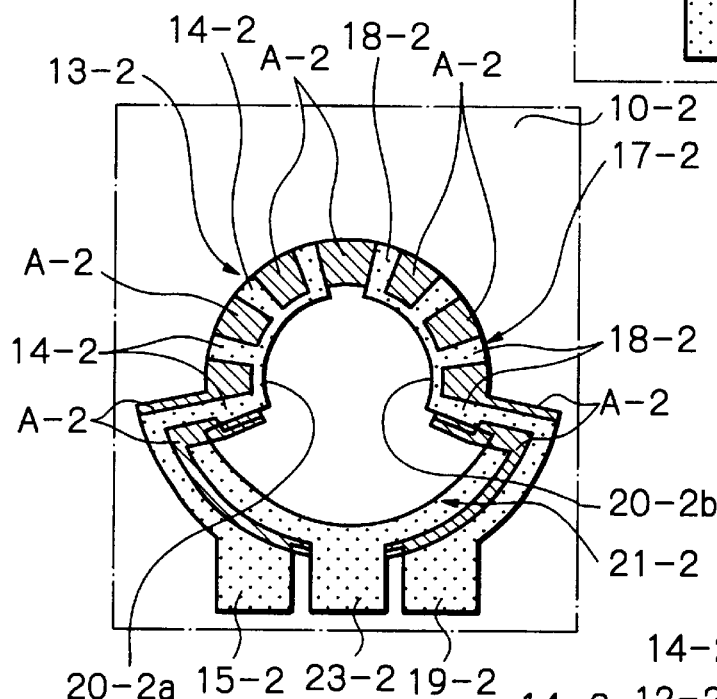
Figure 12C:
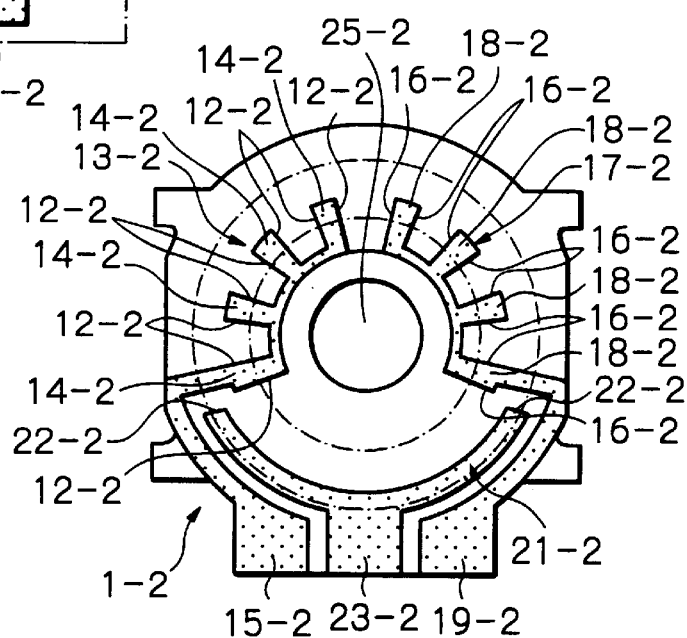

FIGS. 12(a), 12(b) and 12(c) are plan views showing a method of forming switch patterns on a switch substrate 1-2 for a rotary encoder according to a second embodiment of the present invention. In a manner similar to that of the first embodiment, a substrate 10-2 made of synthetic resin film (e.g., PET film) is prepared and a desired pattern 11-2 is formed on the surface of the substrate by printing a silver paste or carbon paste, as shown in FIG. 12(a).

The shape of the pattern 11-2 includes portions that will become first and second switch pattern groups 13-2, 17-2, a portion that will become a common switch pattern 21-2, and portions that will become terminal connection lands 15-2, 19-2, 23-2.

Next, as shown in FIG. 12(b), the pattern 11-2 is removed by a laser beam. Specifically, pattern-removal portions A-2 indicated by hatching in FIG. 12(b) are portions obtained by removing the pattern 11-2 by laser-generated heat. In this embodiment, only the pattern 11-2 is removed by adjusting the power and focal point of the laser. Depending upon the particular case, however, laser power, etc., may be adjusted so as to remove not only the pattern 11-2 at the pattern-removal portions A but also the underlying substrate 10-2.

In other words, comb-shaped first and second switch pattern groups 13-2, 17-2 and the common switch pattern 21-2 are provided by pattern removal using a laser, and the terminal connection lands 15-2, 19-2, 23-2 are led out from the first and second switch pattern groups 13-2, 17-2 and common switch pattern 21-2, respectively, thereby forming the shape illustrated. The first and second switch pattern groups 13-2, 17-2 each have four switch patterns 14-2, 18-2, respectively, for coded output, connected by connecting pieces 20-2a, 20-2b, respectively. The common switch pattern 21-2 has the shape of a circular arc.

As shown in FIG. 12(c), the portion of the flexible substrate 10-2 externally of the periphery of the switch pattern groups 13-2, 17-2 and a portion corresponding to a center hole 25-2 are removed (by mechanical removal, laser-beam removal or removal by some other method). This completes the switch substrate 1-2.

It should be noted that the removal of the pattern-removal portions A-2 may be formed by mechanical removal relying upon a press or the like instead of using a laser beam. In such case the pattern-removal portions A-2 would become openings.

If the switch pattern groups 13-2, 17-2 and common switch pattern 21-2 are formed on the surface of the switch substrate 1-2 in the manner described above, the external form of each switch pattern can be formed extremely accurately in a manner similar to that of the first embodiment. In particular, portions at sides 12-2, 16-2 of the switch patterns 14-2, 18-2 shown in FIG. 12(c) and portions at sides 22-2 of the common switch pattern 21-2 can be formed accurately to have precise dimensions, and the position of a slider that slides on the patterns (the sliding path is indicated by the two concentric dot-and-dash lines) can be detected with high precision so that an accurate coded output conforming to the position of the slider may be obtained.

Figure 13:
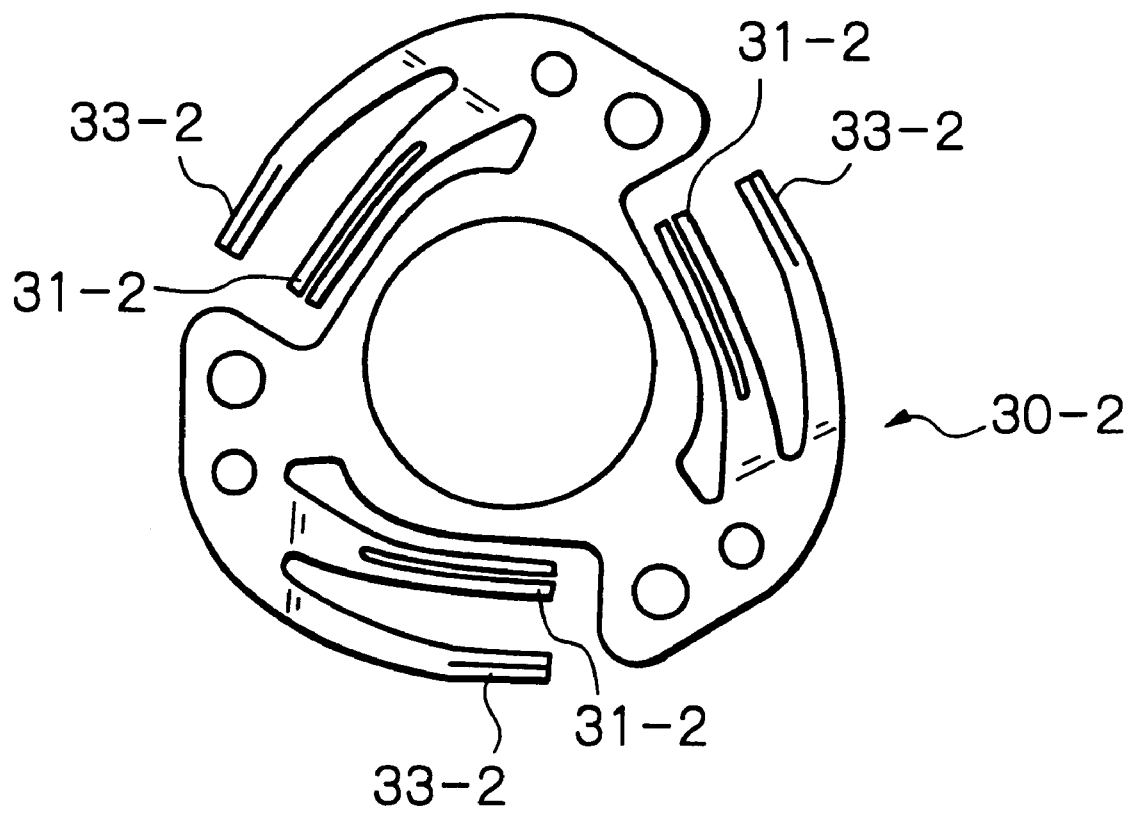
FIG. 13 is a plan view illustrating a slider used with the switch substrate.
Figure 14:
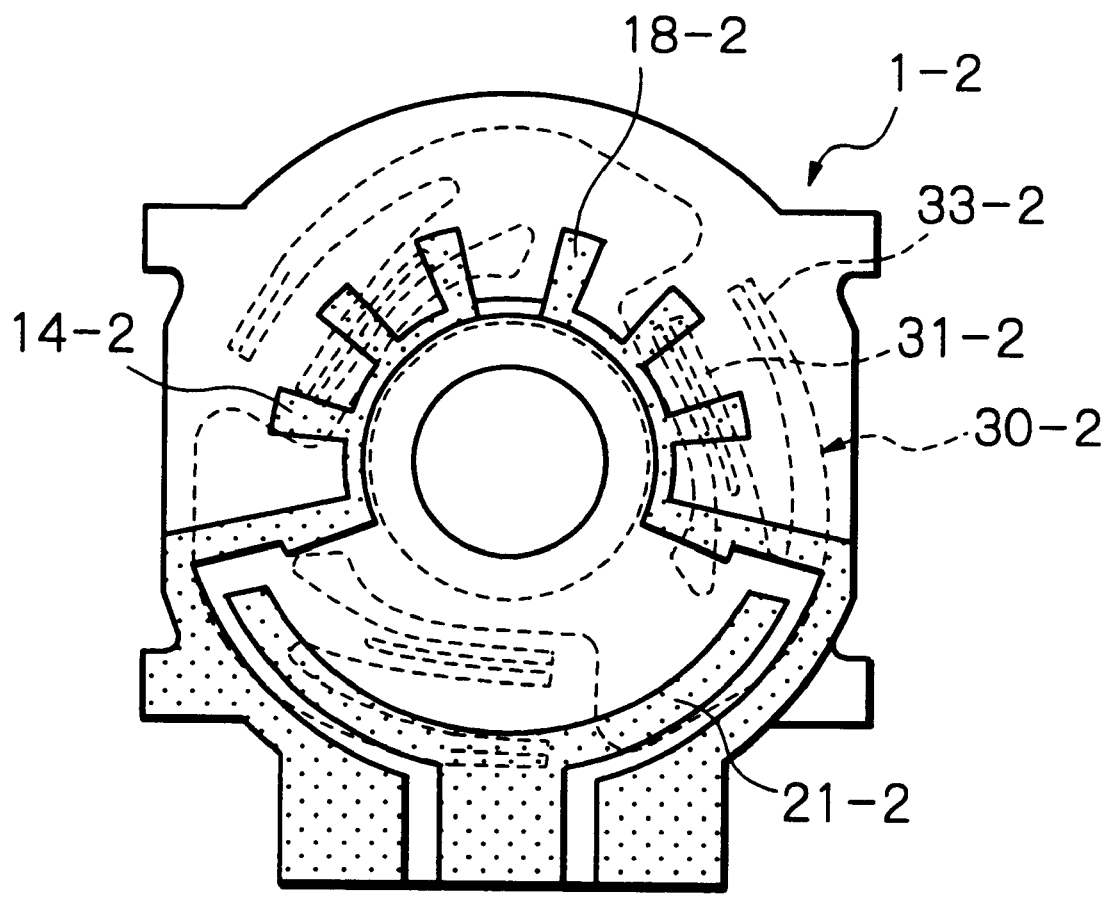
FIG. 14 is a diagram showing a position at which the slider is placed on the switch substrate.

FIG. 13 is a plan view illustrating a slider 30-2 used with the switch substrate 1-2, and FIG. 14 is a diagram showing a position at which the slider 30-2 is placed on the switch substrate 1-2. In actuality, the slider 30-2 is attached to a sliding element (not shown) that is capable of being rotated.

As shown in FIGS. 13 and 14, the slider 30-2 is provided with three sets of sliding contacts 31-2, 33-2 at intervals of 1200. Any one of the outer sliding contacts 33-2 of the three sets of sliding contacts is always in sliding contact with the common switch pattern 21, and the sliding contacts 31-2 on the inner side make or break contact with the switch patterns 14-2, 18-2, whereby desired coded outputs can be produced.

In general the switch substrate 1-2 is used upon being placed and secured on a hard base. In this embodiment, the switch substrate 1-2 is insert-molded in a case 40-2 made of molding resin, as illustrated in FIG. 15.

Figure 15A:
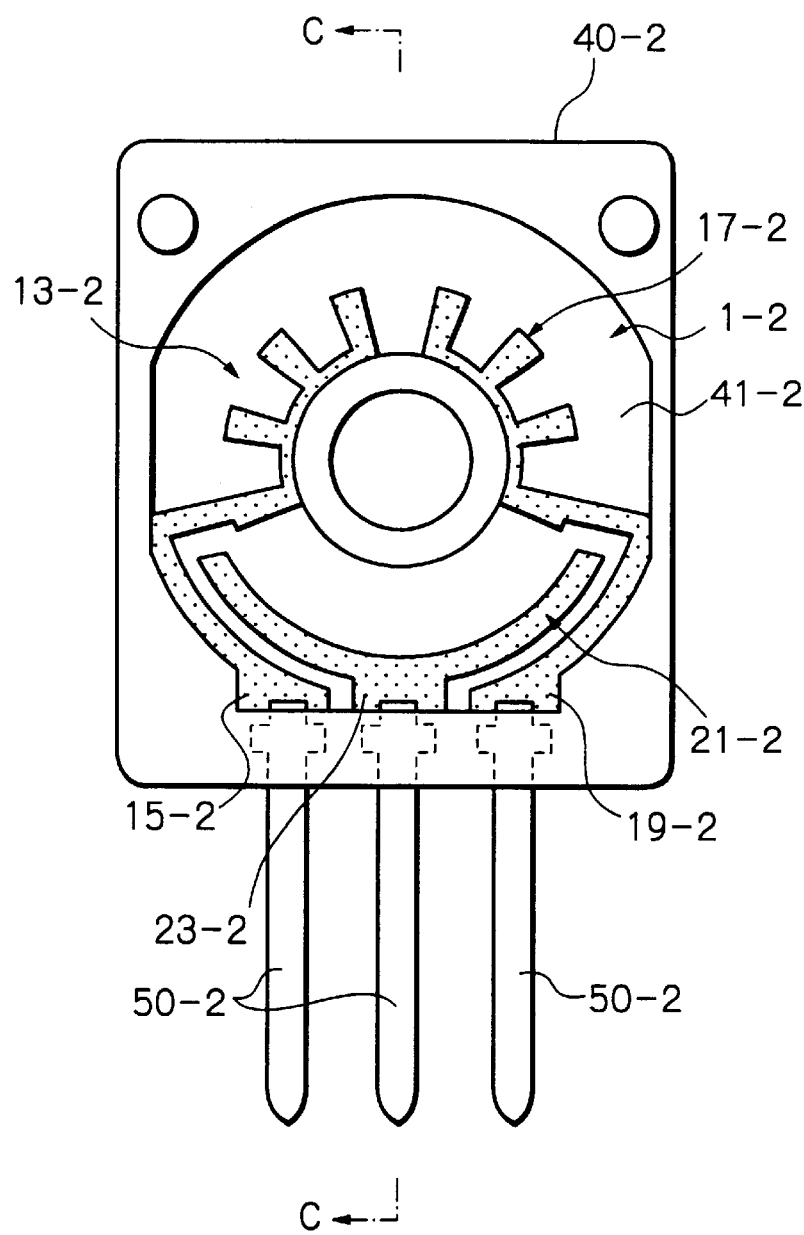
FIG. 15 illustrates the switch substrate insert-molded in a case, in which 15(a) is a plan view and 15(b) a sectional view taken along line C—C in (a)
Figure 15B:
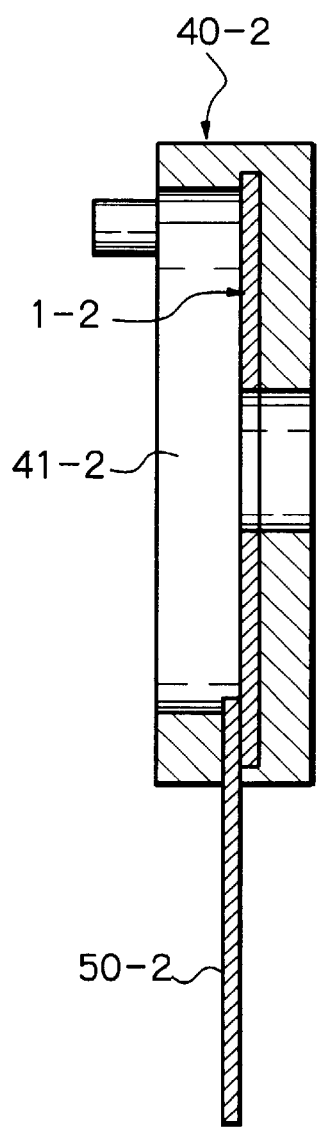

More specifically, FIG. 15 are views illustrating a state in which the switch substrate 1-2 has been insert-molded in the case 40-2, wherein 15(a) is a plan view and 15(b) a sectional view taken along line C—C of 15(a). As illustrated, the case 40-2 is molded in such a manner that the underside and peripheral side surfaces of the switch substrate 1-2 are covered, the case 40-2 being provided with a recess 41-2 exposing the switch pattern groups 13-2, 17-2 and common switch pattern 21-2. A sliding element (not shown) to which the slider 30-2 has been attached is received in the recess 41-2 and is free to rotate.

One ends of terminals 50-2 made of metal plates are in direct abutting contact with respective ones of the terminal connection lands 15-2, 19-2, 23-2, and the abutting portions are embraced from above and below by the molding resin constructing part of the case 40-2, thereby connecting and fixing the terminals.

It should be noted that the case 40-2 is not necessarily required. The switch substrate 1-2 can be used as is or it can be used upon being mounted on a separately molded base.

Third Embodiment

Figure 16:
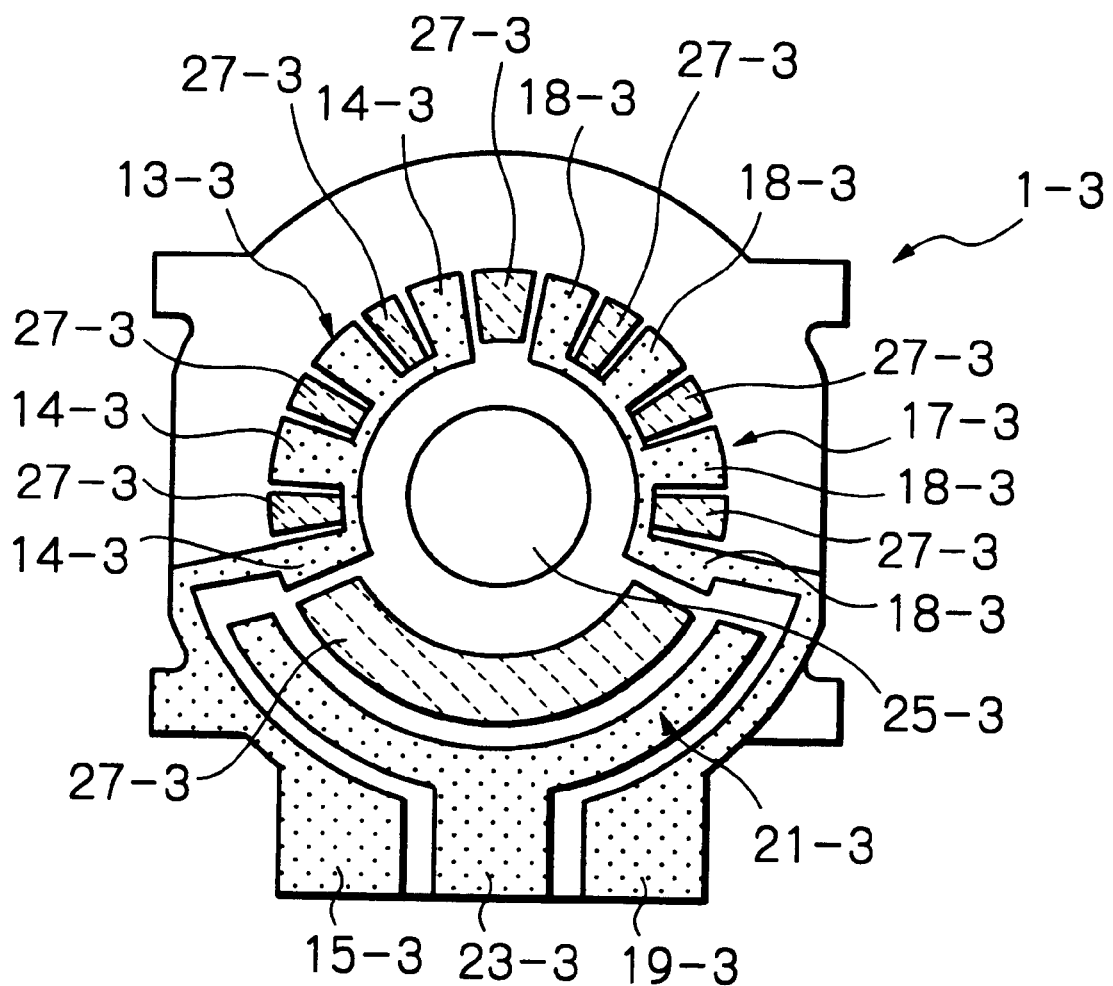
FIG. 16 is a plan view illustrating a switch substrate according to a third embodiment of the present invention.

FIG. 16 is a plan view illustrating a switch substrate 1-3 for a rotary encoder according to a third embodiment of the present invention. The switch substrate 1-3 of this embodiment differs from the switch substrate 1-2 shown in FIG. 12(c) in that insulating patterns 27-3 are formed by being printed in the gaps between switch patterns 14-3, 18-3 of first and second switch patterns 13-3, 17-3, respectively. This switch substrate 1-3 also is used with the slider 30-2 shown in FIG. 13.

The insulating patterns 27-3 are formed for the following reason: Since the height (in the direction of thickness) of the gap portions between the switch pattern groups 14-3 is lower than that of the switch patterns 14-3, unevenness is produced between these portions. Consequently, there is the danger that the switch patterns 14-3 will be worn away by the sliding contacts 31-2 of the slider 30-2. Forming the insulating patterns 27-3 prevents this from occurring. (The above holds true for the switch patterns 18-3 as well.) Specifically, if the height of the above-mentioned gap portions is made the same as that of the switch patterns 14-3, 18-3 by forming the insulating patterns 27-3 in the gaps, as is done is this embodiment, the sliding contacts 31-2 of the slider 30-2 will not move up and down when they are slid between the switch patterns 14-3, 18-3. Instead, they will slide substantially linearly so that wear of the switch patterns 14-3, 18-3 will be reduced. In this embodiment, the shapes of the switch pattern groups 13-3, 17-3 and common switch pattern 21-3 are also formed in a highly precise fashion by mechanical or laser-beam removal. The method of manufacture will now be described.

Figure 17:
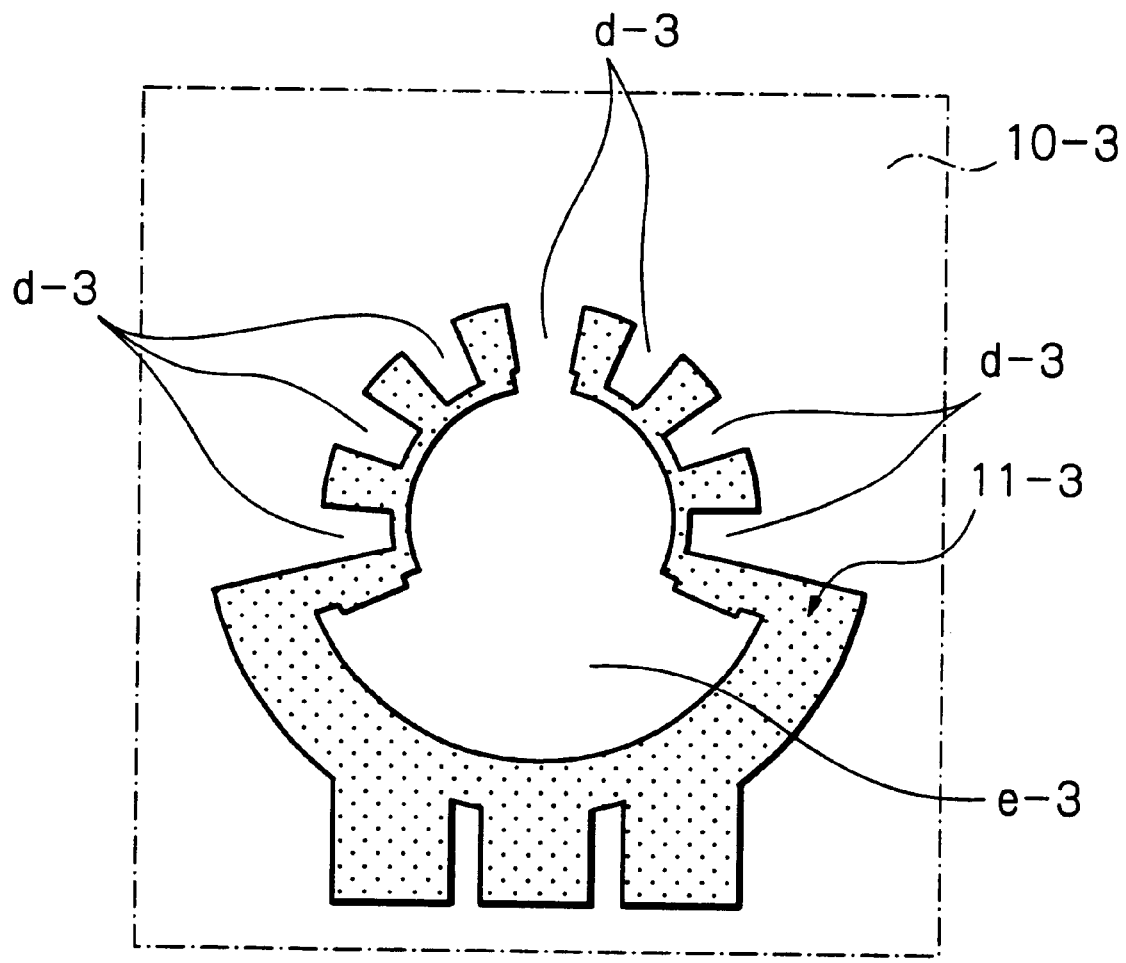
FIG. 17 is a plan view illustrating a method of forming switch patterns on the switch substrate.
Figure 18:
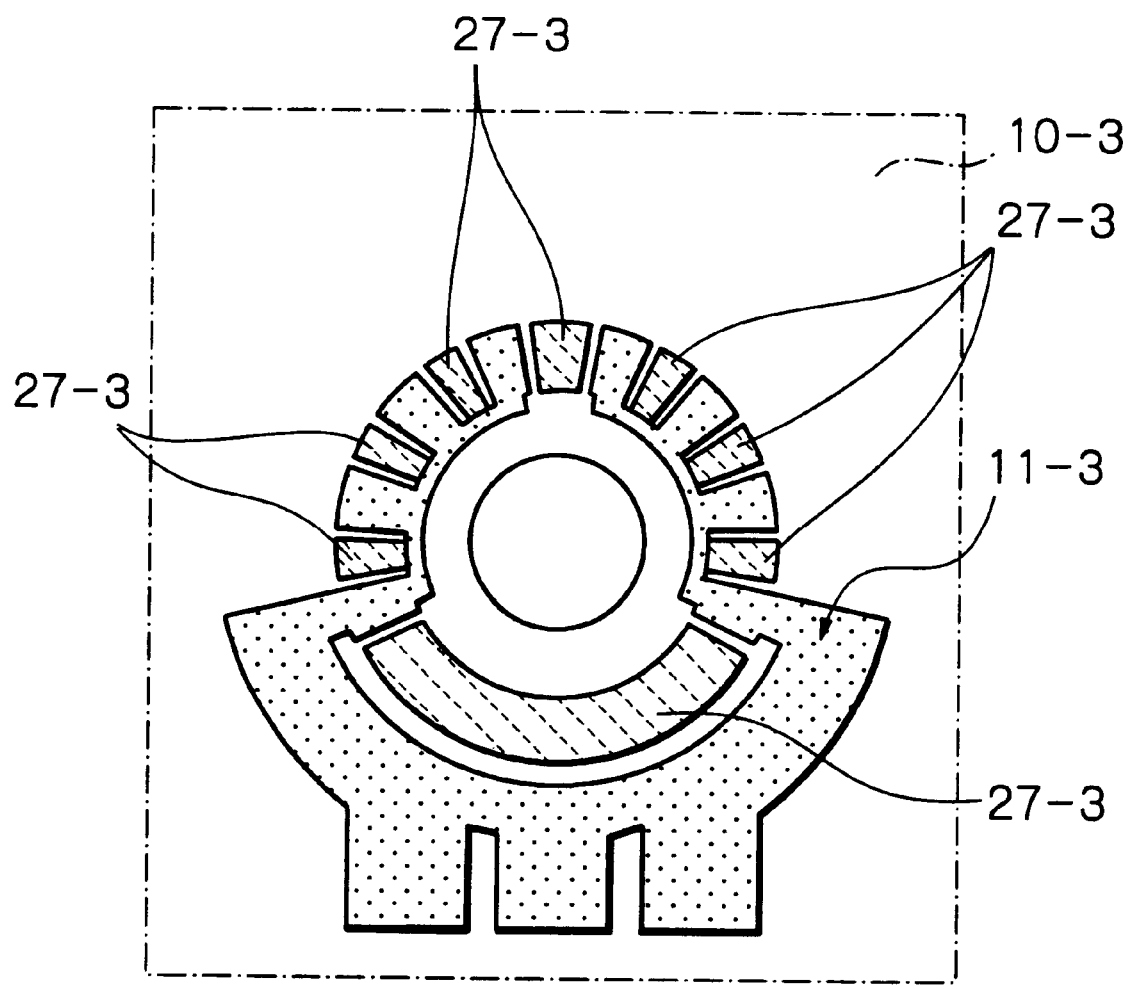
FIG. 18 is a plan view illustrating a method of forming switch patterns on the switch substrate.
Figure 19:
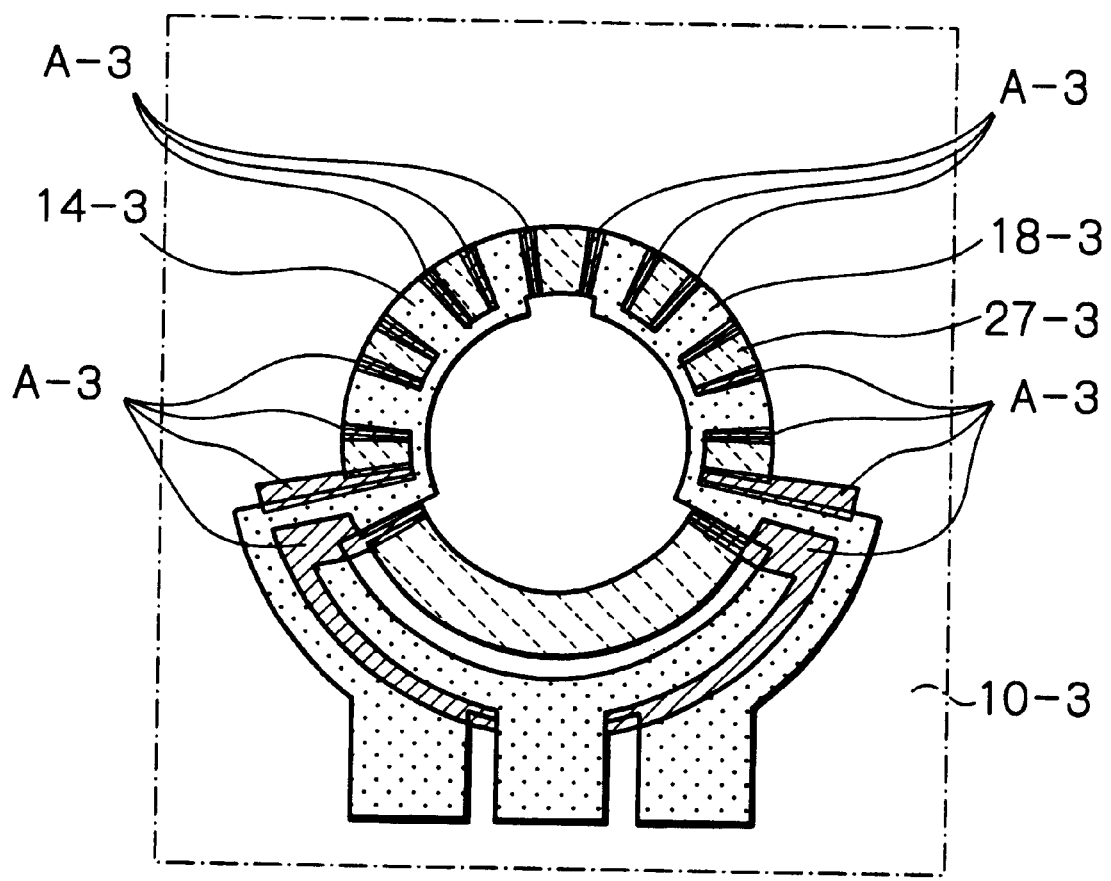
FIG. 19 is a plan view illustrating a method of forming switch patterns on the switch substrate.
Figure 20:
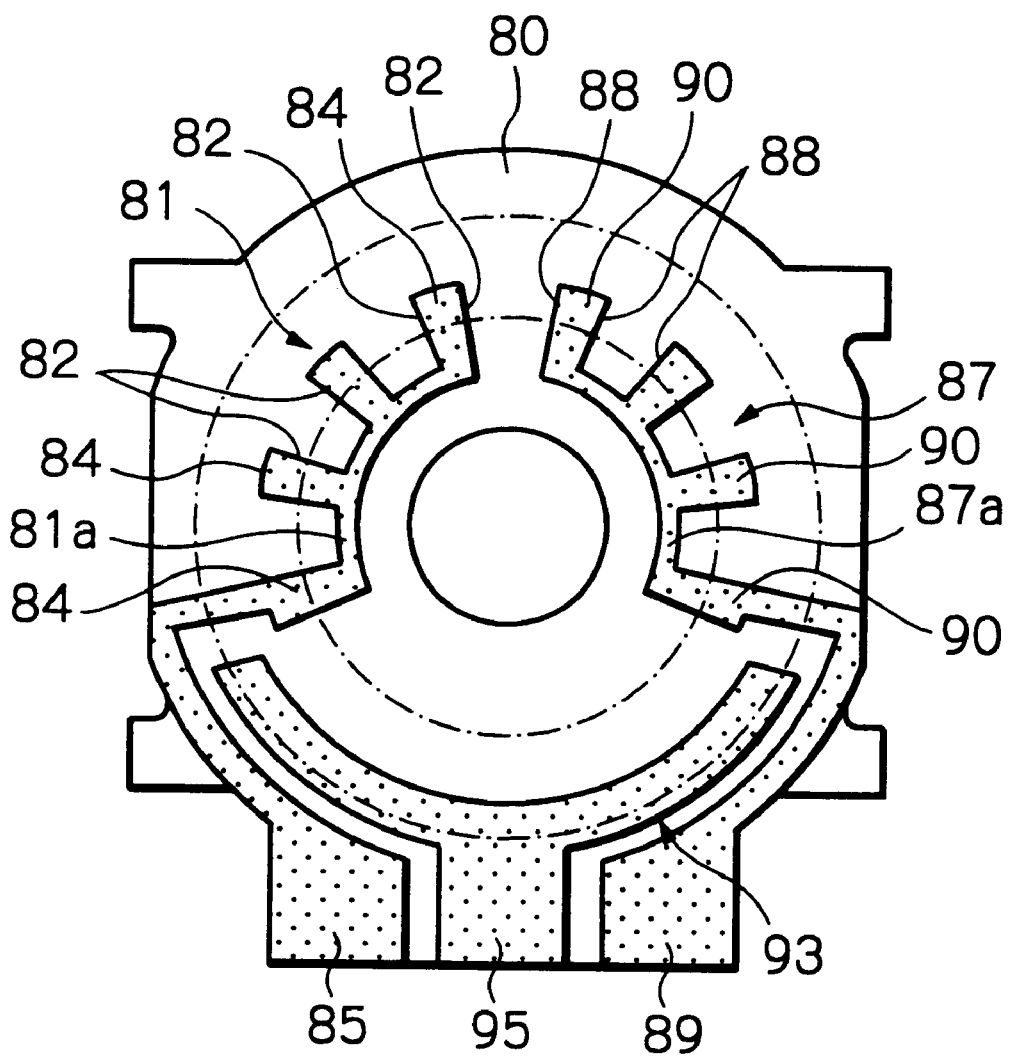
FIG. 20 is a plan view illustrating an example of a switch substrate according to the prior art.

FIGS. 17, 18 and 19 are plan views illustrating a method of forming switch patterns on the switch substrate 1-3 according to the third embodiment. Specifically, first a substrate 10-3 made of synthetic resin film (e.g., PET film) is prepared and a desired pattern 11-3 is formed on the surface of the substrate by printing a silver paste or carbon paste, as shown in FIG. 17.

The shape of the pattern 11-3 includes at least portions that will become first and second switch pattern groups 13-3, 17-3, a portion that will become a common switch pattern 21-3, and portions that will become terminal connection lands 15-3, 19-3, 23-3 shown in FIG. 16. In the case of the pattern 11-3, gaps d-3 are provided beforehand at the portions that will become first and second switch pattern groups 13-3, 17-3.

Next, as shown in FIG. 18, the insulating patterns 27-3 are formed by being printed at the portions of the gaps d-3 and in an ineffective area e-3 devoid of the switch patterns 14-3, 18-3 and located on the circumference of the same circle as that of the gaps d-3. The insulating patterns 27-3 are formed to have a thickness approximately the same as that of the pattern 11-3.

Next, as shown in FIG. 19, the portions that will become the boundaries between the switch patterns 14-3, 18-3 and the insulating patterns 27-3 and necessary locations other than these, i.e., pattern-removal portions A-3 indicated by the hatching in FIG. 19, are removed by a laser beam. As a result, the first and second switch pattern groups 13-3, 17-3, common switch pattern 21-3 and terminal connection lands 15-3, 19-3, 23-3 shown in FIG. 16 are formed. Finally, as shown in FIG. 16, the peripheral portion of the flexible substrate 10-3 and a portion corresponding to a center hole 25-3 are removed to complete the switch substrate 1-3. It should be noted that the pattern-removal portions A-3 shown in FIG. 19 may be removed by mechanical means (press-cutting). In such case good efficiency can be achieved if the peripheral portion of the flexible substrate 10-3 and the portion corresponding to the center hole 25-3 are removed mechanically at the same time.

If the switch substrate 1-3 is formed in the manner described above, the shapes of the switch pattern groups 13-3, 17-3 and common switch pattern 21-3 can be formed highly accurately in a manner similar to that of the first and second embodiments, and the position of the slider 30-2 that slides on the patterns can be detected with high precision so that an accurate coded output conforming to the position of the slider 30-2 may be obtained. In addition, due to the insulating patterns 27-3, the sliding contacts 31-2 of the slider 30-2 will not move up and down when they are slid. As a result, it is possible to prevent the switch patterns 14-3, 18-3 from being worn by the sliding contacts 31-2.

It should be noted that the width of the gaps between the switch patterns 14-3 (18-3), which are formed by the pattern-removal portions A-3, and the insulating patterns 27-3 preferably should be such that even when the sliding contacts 31-2 of the slider 30-2 (the sliding contacts 31-2, 33-2 are curved to have an arcuate shape so as to protrude in the direction of the substrate 1-3) are situated above the gaps, they will be held by the switch patterns 14-3 (18-3) and insulating patterns 27-3 on both sides so as not to make contact with the surface of the flexible substrate 10-3 directly below the gaps. Otherwise, the sliding contacts 31-2, after descending temporarily onto the surface of the flexible substrate 10-3 from the insulating patterns 27-3, will slide up on the switch patterns 14-3, 18-3. As a result, the degree of wear sustained by the switch patterns 14-3, 18-3 will be the same as that sustained if the insulating patterns 27-3 were not provided.

When both the insulating patterns 27-3 and pattern 113 shown in FIG. 18 are printed, portions of partial overlap occur at the boundaries due to wet-on-wet coating error. However, these portions do not result in problems because they are removed by laser or mechanical means in the manner shown in FIG. 19. In other words, even if the patterns 13-3, 17-3, 21-3, 27-3 contain some printing error or printing offset, portions requiring precision such as the patterns 13-3, 17-3, 21-3, 27-3 can be provided with the necessary dimensions eventually by laser or mechanical removal. Hence, no problems arise. It is also possible to adopt an arrangement in which the insulating patterns 27-3 and pattern 11-3 are printed beforehand in such a manner that the boundary portions are allowed to partially overlap (not as a result of error), after which the overlapping portions are removed. arrangement in which the insulating patterns 27-3 and pattern 11-3 are printed beforehand in such a manner that the boundary portions are allowed to partially overlap (not as a result of error), after which the overlapping portions are removed.

In the case of the switch substrate 1-3, any difference in level on the sliding surface of the sliding contacts 31-2 is reduced by the insulating patterns 27-3, thereby preventing the switch patterns 14-3, 18-3 from being worn away by the sliding contacts 31-2. At the same time, the pattern 11-3 is removed by laser or by mechanical means. This makes it possible to form the switch patterns 14-3, 18-3 easily and in a highly precise fashion.

The materials of the substrate and molding resin are not limited to those described in the foregoing embodiments, and materials other than those mentioned may be employed. The substrate may be a hard substrate depending upon the particular case.

Further, the foregoing embodiments illustrate an example in which the switch pattern groups 13(-2, -3), 17(-2, -3) and common switch pattern 21(-2, -3) are formed by printing. However, the switch patterns may be formed by other methods, including etching of copper foil. What is essential is that the switch patterns consist of a material that can be removed mechanically or by a laser beam. It goes without saying that the shape of the switch patterns can be changed in various ways.

Though the foregoing embodiments illustrate an example in which the present invention is applied to a switch substrate for a rotary encoder, it goes without saying that the invention can be applied to various other switch substrates as well.

In the foregoing embodiments, the molding resin is molded on the switch substrate 1 (1-2) about the periphery of the metal terminals 50 (50-2) attached thereto. However, a structure may be adopted in which a film constructing the switch substrate 1 (1-2) is lead out to the exterior directly without using the metal terminals 50 (50-2). If a film is used as the substrate, then a separate circuit can be provided directly on the film led out to the exterior.

As many apparently widely different embodiments of the present invention can be made without departing from the spirit and scope thereof, it is to be understood that the invention is not limited to the specific embodiments thereof except as defined in the appended claims.

What is claimed is:

1. A method of molding a molding resin case on a substrate having openings, comprising:
   preparing the substrate having openings, a first mold and a second mold, and clamping the substrate having the openings between the first mold and the second mold in such a manner that a first side of the substrate is brought into contact with a surface of the first mold while, simultaneously, a cavity provided in the second mold is arranged to oppose a second side of the substrate;
   charging molten molding resin into the cavity provided in the second mold to thereby fill the cavity and the openings of the substrate with the molding resin; and
   extracting the substrate, which has the molding resin attached thereto, by separating the first mold and the second mold after the molding resin hardens to form the molding resin case.

2. The method according to claim 1, wherein the substrate having the openings is made of synthetic resin.

3. The method according to claim 2, wherein the substrate having the openings is a switch substrate having switch patterns formed on the first side thereof, and the switch patterns and the openings are situated on a path along which a slider makes sliding contact with the switch patterns.

4. The method according to claim 3, wherein the second mold has pressing portions for pressing a periphery of the openings of the substrate against the first mold.

5. The method according to claim 4, wherein positions at which the pressing portions press the substrate against the first mold are situated at the periphery of the openings but not on the path along which the slider makes sliding contact with the switch patterns.

6. The method according to claim 3, wherein the switch substrate is manufactured by forming preliminary patterns on the surface of the substrate in advance, and then forming the openings by removing pattern-removal portions of the preliminary patterns, thereby forming the switch patterns with which the slider makes sliding contact.

7. The method according to claim 1, wherein the substrate having the openings is a switch substrate having switch patterns formed on the first side thereof, and the switch patterns and the openings are situated on a path along which a slider is to make sliding contact with the switch patterns.

8. The method according to claim 7, wherein the second mold has pressing portions for pressing a periphery of the openings of the substrate against the first mold.

9. The method according to claim 8, wherein positions at which the pressing portions press the substrate against the first mold are situated at the periphery of the openings but not on the path along which the slider is to make sliding contact with the switch patterns.

10. The method according to claim 7, wherein the switch substrate is manufactured by forming preliminary patterns on the surface of the substrate in advance, and then forming the openings by removing pattern-removal portions of the preliminary patterns, thereby forming the switch patterns with which the slider is to make sliding contact.

11. An apparatus comprising:
    a switch substrate having openings and switch patterns formed on a first side thereof, said switch patterns and said openings being situated on a path along which a slider is to make sliding contact with said switch patterns; and
    a molding resin case attached to said switch substrate so as to contact a second side of said switch substrate having no switch patterns thereon, wherein a height of a surface of said molding resin case exposed at said openings provided in said switch substrate coincides with a height of said first side of said switch substrate having said switch patterns thereon.

12. A method of molding a molding resin case on a switch substrate, comprising:
    manufacturing the switch substrate by forming preliminary patterns on a surface of a film-like substrate in advance, then providing openings by removing pattern-removal portions of the preliminary patterns to thereby form switch patterns with which a slider is to make sliding contact;
    preparing the switch substrate, a first mold and a second mold and clamping the switch-substrate between the first mold and the second mold in such a manner that a first side of the switch substrate is brought into contact with a surface of the first mold while, simultaneously, a cavity provided in the second mold is arranged to oppose a second side of the switch substrate;
    charging molten molding resin into the cavity provided in the second mold to thereby fill the cavity and the openings of the switch substrate with the molding resin; and
    extracting the switch substrate, which has the molding resin attached thereto, by separating the first mold and the second mold after the molding resin hardens to form the molding resin case.

13. A method of forming switch patterns, with which a slider is to make sliding contact, on a switch substrate, comprising:
    forming preliminary patterns on a surface of the substrate in advance; and
    forming switch patterns by removing pattern-removal portions of the preliminary patterns.

14. The method according to claim 13, wherein said removal of the pattern-removal portions is mechanical removal or removal by laser beam.

15. The method according to claim 13, wherein the pattern-removal portions comprise only a portion of the preliminary patterns on the surface of the substrate, or comprise a portion of the preliminary patterns on the surface of the substrate and an underlying portion of the substrate.

16. A switch substrate having switch patterns, which are to be slidingly contacted by a slider, formed thereon by removing pattern-removal portions of preliminary patterns that have been formed on the substrate.

17. A method of forming switch patterns, with which a slider is to make sliding contact, on a switch substrate, comprising:
    forming preliminary patterns on a surface of the substrate in advance;
    forming insulating patterns between portions of the preliminary patterns that are to become switch patterns; and
    forming the switch patterns by removing pattern-removal portions at boundaries between the portions of the preliminary patterns and the insulating patterns.

18. The method according to claim 17, wherein said removal of the pattern-removal portions is mechanical removal or removal by laser beam.

19. The method according to claim 17, wherein the pattern-removal portions comprise only a portion of the preliminary patterns on the surface of the substrate, or comprise a portion of the preliminary patterns on the surface of the substrate and an underlying portion of the substrate.

20. A switch substrate comprising switch patterns, with which a slider is to make sliding contact, formed on a substrate, insulating patterns being formed between portions of said switch patterns, wherein pattern-removal portions are formed between the portions of the switch patterns and the insulating patterns.

* * * * *